United States Patent

Fujishima

[11] Patent Number: 6,066,863
[45] Date of Patent: May 23, 2000

[54] LATERAL SEMICONDUCTOR ARRANGEMENT FOR POWER IGS

[75] Inventor: Naoto Fujishima, Nagano, Japan

[73] Assignee: Fuji Electric Co., Ltd., Japan

[21] Appl. No.: 09/064,269

[22] Filed: Apr. 22, 1998

Related U.S. Application Data

[60] Division of application No. 08/684,434, Jul. 19, 1996, Pat. No. 5,801,420, which is a continuation-in-part of application No. 08/525,447, Sep. 8, 1995, abandoned.

[30] Foreign Application Priority Data

Sep. 8, 1994 [JP] Japan ................... 6-214401
Jul. 24, 1995 [JP] Japan ................... 7-186772

[51] Int. Cl.[7] .......... H01L 29/74; H01L 31/111; H01L 29/76; H01L 29/94; H01L 31/062
[52] U.S. Cl. .......... 257/133; 257/143; 257/378; 257/120
[58] Field of Search ................... 257/133, 143, 257/335, 337, 343, 378, 120

[56] References Cited

U.S. PATENT DOCUMENTS 5,258,641  11/1993  Kida et al. ................ 257/490
5,286,995  2/1994   Malhi ...................... 257/549
5,432,370  7/1995   Kitamura et al. .......... 257/339

*Primary Examiner*—Mahshid Saadat
*Assistant Examiner*—Allan R. Wilson
*Attorney, Agent, or Firm*—Morrison Law Firm

[57] ABSTRACT

A lateral semiconductor device, such as an LIGBT, LMOSFET, lateral bipolar transistor, lateral thyristor, or lateral MOS control thyristor, includes a device area surrounded by an n-type region in an n-channel lateral semiconductor device or by a p-type region in a p-channel lateral semiconductor device. Connecting the n-type region in the n-channel lateral semiconductor device or the p-type region in the p-channel lateral semiconductor device at a same potential as a first main electrode suppresses operation of parasitic transistors, as well as prevents carrier accumulation in isolated regions or a substrate. As a result, a switching loss of the lateral semiconductor device is greatly reduced, a switching speed of the lateral semiconductor device is improved, and a current capacity of the lateral semiconductor device is increased.

6 Claims, 16 Drawing Sheets

LATERAL SEMICONDUCTOR ARRANGEMENT FOR POWER IGS

This application is a divisional of application Ser. No. 08/684,434, filed on Jul. 19, 1996, now issued as U.S. Pat. No. 5,801,420, which in turn is a continuation-in-part of application Ser. No. 08/525,447, filed on Sep. 8, 1995, now abandoned.

BACKGROUND OF THE INVENTION

The present invention relates to a lateral semiconductor arrangement. More specifically, the present invention relates to a lateral semiconductor device used in a power integrated circuit (hereinafter referred to as "power IC") that drives a switching power supply, flat panel display, motor, or other such device.

Referring to FIG. 24, a cross section of a lateral insulated gate bipolar transistor (hereinafter referred to as an "LIGBT") is shown, as an example of a conventional lateral semiconductor device, integrated into a power IC. This conventional LIGBT includes a p-type substrate 2401 on which an n-type buried layer 2402 is formed. An n-type epitaxial layer 2403 is layered onto n-type buried layer 2402. An n-type sink layer 2404 extends from a surface of n-type epitaxial layer 2403 to n-type buried layer 2402. A p-type isolation layer 2405 isolates a device area from the surface of n-type epitaxial layer 2403 to p-type substrate 2401.

A p-type base region 2407 is in an upper portion of n-type epitaxial layer 2403. A p-type contact region 2413 and an n-type emitter region 2415 are in p-type base region 2407. A p-type collector region 2414 is in a surface portion of n-type sink layer 2404. A thick oxide film 2410 extends over a portion of n-type epitaxial layer 2403 between p-type base region 2407 and n-type sink layer 2404. A gate electrode 2412, fixed via a gate oxide film 2411, extends from n-type emitter region 2415 across a surface of p-type base region 2407 to epitaxial layer 2403. Gate electrode 2412 is connected to a terminal G. An emitter electrode 2417 contacts both n-type emitter region 2415 and p-type contact region 2413. Emitter electrode 2417 is connected to a terminal E. A collector electrode 2418 on p-type collector region 2414 is connected to a terminal C. In some devices, an inter-layer insulation film, metal wiring, passivation film, or other such material is formed.

In the above described device, a voltage, higher than a threshold voltage and positive with respect to the potential of emitter electrode 2417, is applied to gate electrode 2412. The applied voltage creates an inversion layer in a surface layer of p-type base region 2407 beneath gate electrode 2412. Electrons flow from n-type emitter region 2415 into n-type epitaxial layer 2403 through the inversion layer where they are injected into collector region 2414. As a result, the electron current functions as a base current of a pnp transistor consisting of p-type collector region 2414, n-type epitaxial layer 2403, and p-type base region 2407. The base current turns on this pnp transistor to cause conductivity modulation and a large current between the terminals C and E.

However, the device of FIG. 24 has a number of drawbacks. The device of FIG. 24 includes a parasitic pnp transistor Q1 consisting of p-type collector region 2414, n-type sink layer 2404, n-type epitaxial layer 2403 and n-type buried layer 2402, and p-type substrate 2401. Electrons, as the minority carriers, accumulate in p-type substrate 2401. Changing state, i.e., switching, requires considerable time to extract and extinguish accumulated electrons, thereby causing a remanent current. The remanent current elongates switching time and increases switching loss.

The device of FIG. 24 also includes a parasitic transistor Q2 consisting of p-type collector region 2414, n-type sink layer 2404, and p-type isolation layer 2405. When the device is used as a high-side switch of a half-bridge circuit or other such circuit, a parasitic current flows from collector electrode 2418 to p-type substrate 2401 through parasitic transistors Q1 and Q2. These parasitic currents increase switching loss.

Referring to FIG. 25, a cross section of another conventional LIGBT integrated into a power IC is shown. This conventional LIGBT includes a p-type substrate 2501 on which an n-type well region 2503 is formed. A p-type base region 2507 is formed in a part of n-type well region 2503. An n-type emitter region 2515 and a p-type contact region 2513 are formed in an upper portion of p-type base region 2507. An emitter electrode 2517 contacts n-type emitter region 2515 and p-type contact region 2513 in common. Emitter electrode 2517 is connected to a terminal E.

An n-type buffer region 2509 is formed in a portion of n-type well region 2503. A p-type collector region 2514 and an n-type contact region 2516 are formed in an upper portion of n-type buffer region 2509. A collector electrode 2518 is on p-type collector region 2514. Collector electrode 2518 is connected to a terminal C. An anode electrode 2519 is on n-type contact region 2516.

A thick oxide film 2510 on a portion of n-type well region 2503 extends between n-type buffer region 2509 and p-type base region 2507. A gate electrode 2512 connected to a terminal G is fixed via a gate oxide film 2511 to a portion of n-type base region 2507 extending between a portion of n-type well region 2503 and n-type emitter region 2515. In devices of this type, an inter-layer insulation film, metal wiring, passivation film, or such material is sometimes formed.

In this conventional device, a voltage, higher than a threshold voltage and positive with respect to a potential of emitter electrode 2517, is applied to gate electrodes 2512. The applied voltage creates an inversion layer in a surface layer of p-type base region 2507 beneath gate electrode 2512. Electrons flow from n-type emitter region 2515 into n-type well region 2503 through the inversion layer, where they are injected into p-type collector region 2514. As a result, the electron current functions as a base current of a pnp transistor consisting of p-type collector region 2514, n-type well region 2503, and p-type base region 2507. The base current turns on this pnp transistor, causing conductivity modulation and a large current between terminals C and E.

The device of FIG. 25 is less costly than the device shown in FIG. 24 because it does not need any epitaxial wafer such as n-type epitaxial layer 2403. This device is used as a low-side switch because the device can not be provided with a buried layer. A parasitic transistor Q3 exists consisting of p-type collector region 2514, n-type well region 2503, and p-type substrate 2501. This device is subject to a parasitic current that flows through parasitic pnp transistor Q3 through the same mechanism as described in the above paragraph. Although the prior art is explained by way of an LIGBT, these drawbacks also occur in lateral MOSFET's, bipolar transistors, thyristors, and MOS control thyristors (hereinafter referred to as an "LMCT").

OBJECTS AND SUMMARY OF THE INVENTION

Accordingly, an object of present invention is to overcome the drawbacks and limitations of the prior art.

Another object of the present invention is to shorten a turn-off time and reduce switching loss of a lateral semiconductor device, such as an IGBT, transistor, or thyristor, integrated into a power IC.

Another object of the present invention is to provide a lateral semiconductor arrangement and method which prevents parasitic transistors from operating.

A further object of the present invention is to provide a lateral semiconductor arrangement and method which suppresses minority carrier accumulation in both a semiconductor substrate and an isolation layer to shorten switching time and reduce switching loss.

Briefly stated, a lateral semiconductor device, such as an LIGBT, LMOSFET, lateral bipolar transistor, lateral thyristor, or lateral MOS control thyristor, includes a device area surrounded by an n-type region in an n-channel lateral semiconductor device or by a p-type region in a p-channel lateral semiconductor device. Connecting the n-type region in the n-channel lateral semiconductor device or the p-type region in the p-channel lateral semiconductor device at a same potential as a first main electrode suppresses operation of parasitic transistors, as well as prevents carrier accumulation in isolated regions or a substrate. As a result, a switching loss of the lateral semiconductor device is greatly reduced, a switching speed of the lateral semiconductor device is improved, and a current capacity of the lateral semiconductor device is increased.

According to an embodiment of the present invention, a lateral semiconductor arrangement includes a semiconductor substrate of a first conductivity type, a first semiconductor region of a second conductivity type on the semiconductor substrate, a semiconductor device, the semiconductor device including a well region of the first conductivity type in a surface portion of the first semiconductor region, a first main electrode on the well region, a second main electrode on the well region, and a control electrode disposed above the well region.

According to an embodiment of the present invention, a method of using a lateral semiconductor arrangement including a semiconductor substrate of a first conductivity type, a semiconductor region of a second conductivity type on the semiconductor substrate, a well region of the first conductivity type in a surface portion of the semiconductor region, a first main electrode on the well region; a second main electrode on the well region, a control electrode above the well region, and an auxiliary electrode on the semiconductor region of the second conductivity type, includes applying a bias potential to the auxiliary electrode, such that the bias potential is higher than a potential of the first main electrode and higher than a potential of the second main electrode.

According to an embodiment of the present invention, a method of using a lateral semiconductor arrangement including a semiconductor substrate of a first conductivity type, a semiconductor region of a second conductivity type on the semiconductor substrate, a well region of the first conductivity type in a surface portion of the semiconductor region, a region of the second conductivity type adjacent to the semiconductor region of the second conductivity type, a first main electrode on the well region, a second main electrode on the well region, a control electrode above the well region, and an auxiliary electrode on the region of the second conductivity type, includes applying a bias potential to the auxiliary electrode, the bias potential being higher than a potential of the first electrode and higher than a potential of the second main electrode.

According to an embodiment of the present invention, a lateral semiconductor device having a channel of a first conductivity type includes a device area surrounded by a region of the first conductivity type, a first main electrode, and means for connecting the region of the first conductivity type at a same potential as the first main electrode, wherein operation of a parasitic transistor is suppressed.

According to a basic aspect of the invention, the drawbacks of the prior art are obviated by a lateral semiconductor arrangement of the invention which includes a semiconductor layer of a first conductivity type; a semiconductor region of a second conductivity type on the semiconductor layer; a semiconductor device; the semiconductor device including a well region of the first conductivity type in a surface portion of the semiconductor region; a first main electrode on the well region; a second main electrode on the well region; and a control electrode above the well region.

Advantageously, a lateral semiconductor arrangement further includes an auxiliary electrode on the semiconductor region of the second conductivity type. Preferably, the first main electrode is electrically connected to the auxiliary electrode.

Advantageously, a lateral semiconductor arrangement further includes a region of the second conductivity type in adjacent to the semiconductor region of the second conductivity type. Preferably, this lateral semiconductor arrangement further includes an auxiliary electrode on the region of the second conductivity type, and its first main electrode is electrically connected to the auxiliary electrode.

According to an embodiment of the invention, a lateral semiconductor arrangement further includes an insulation film which covers the semiconductor region of the second conductivity type and the region of the second conductivity type. On the insulation film, the auxiliary electrode is not disposed.

According to an embodiment of the invention, the semiconductor device is a lateral insulated gate bipolar transistor.

Advantageously, the lateral insulated gate bipolar transistor comprises a first base region of the first conductivity type in a first portion of the well region of the first conductivity type, an emitter region of the second conductivity type in the first base region, a second base region of the second conductivity type in a second portion of the well region, the second base region being spaced apart laterally from the first base region, a collector region of the first conductivity type above the second base region, the control electrode comprises a poly-crystalline silicon gate electrode fixed via a gate insulation film to at least one portion of the well region and to a portion of the first base region between the second base region and the emitter region, the second main electrode comprises an emitter electrode making contact in common with the emitter region and the first base region, and the first main electrode comprises a collector electrode on the collector region.

The base region of the second conductivity type may be expanded and the base region of the first conductivity type may be formed in a surface portion of the expanded base region of the second conductivity type.

Alternatively, the base region of the first conductivity type may be expanded and the base region of the second conductivity type may be formed in a surface portion of the expanded base region of the second conductivity type.

Alternatively, the base region of the first conductivity type may be expanded so widely that the base region of the first conductivity type may overlap the well region of the first conductivity type, in the surface portion of which the base region of the second conductivity type is contained.

Alternatively, the base region of the first conductivity type may contain the base region of the second conductivity type in its surface portion and may not contain the emitter region of the second conductivity type.

According to an embodiment of the invention, the semiconductor device is a lateral MOSFET.

Advantageously, the lateral MOSFET comprises a base region of the second conductivity type in the well region, a source region of the first conductivity type above a first portion of the base region, a drain region of the first conductivity type in a second portion of the base region, the drain region being spaced apart laterally from the source region, the control electrode comprises a gate electrode fixed via a gate insulation film to a portion of the base region, the portion extending between the source region and the drain region, the second main electrode comprises a source electrode making common contact with the source region and the base region, the first main electrode comprises a drain electrode on the drain region.

Alternatively, the base region of the first conductivity type may be expanded such that the source region of the first conductivity type is contained in its surface portion.

Advantageously, the lateral MOSFET comprises a drain region of the second conductivity type in a first portion of the well region, a source region of the second conductivity type in a second portion of the well region, the source region being spaced apart laterally from the drain region, the control electrode comprises a gate electrode fixed via a gate insulation film to a portion of the well region, the portion extending between the source region and the drain region, the second main electrode comprises a source electrode on the source region, and the first main electrode comprises a drain electrode on the drain region.

According to an embodiment of the invention, the semiconductor device is a lateral bipolar transistor.

Advantageously, the lateral bipolar transistor comprises a base region of the second conductivity type in a first portion of the well region, an emitter region of the first conductivity type above the base region, a collector region of the first conductivity type in a second portion of the well region, the collector region being spaced apart laterally from the base region, the control electrode comprises a base electrode on the base region, the first main electrode comprises an emitter electrode on the emitter region, and the second main electrode comprises a collector electrode on the collector region.

Alternatively, the base region of the foregoing lateral bipolar transistor may be expanded and the collector region of the first conductivity type may be contained in a surface portion of the expanded base region of the second conductivity type.

Advantageously, the lateral bipolar transistor, with opposite polarity to the foregoing lateral bipolar transistor, comprises a base region of the first conductivity type in the well region, a collector region of the second conductivity type in a first portion of the base region, an emitter region of the second conductivity type in a second portion of the base region, the emitter region being spaced apart laterally from the collector region, the control electrode comprises a base electrode on the base region, the second main electrode comprises an emitter electrode on the emitter region, and the first main electrode comprises a collector electrode on the collector region.

Alternatively, the base region of the second conductivity type may be expanded and the collector region of the first conductivity type may be contained in a surface portion of the expanded base region.

Alternatively, the well region of the first conductivity type may be expanded such that the expanded well region functions also as the base region of the first conductivity type, thereby to omit the base region of the first conductivity type.

Alternatively, the base region of the first conductivity type may contain the collector region of the first conductivity type and may not contain the emitter region of the first conductivity type.

According to an embodiment, the semiconductor device is a lateral thyristor.

Advantageously, the lateral thyristor comprises a first base region of the first conductivity type in a first portion of the well region, a cathode region of the second conductivity type in the first base region, a second base region of the second conductivity type in a second portion of the well region, the second base region being spaced apart laterally from the first base region, an anode region of the first conductivity type above the second base region, the control electrode comprises a gate electrode on the first base region, the second main electrode comprises a cathode electrode on the cathode region, and the first main electrode comprises an anode electrode on the anode region.

Alternatively, the base region of the second conductivity type may be expanded and the base region of the first conductivity type may be disposed in its surface portion.

Alternatively, the base region of the first conductivity type may be expanded and the base region of the second conductivity type may be disposed in its surface portion.

Alternatively, the well region of the first conductivity type may be such that it functions also as the base region of the first conductivity type, thereby to omit the base region of the first conductivity type.

Alternatively, the base region of the first conductivity type may contain the base region of the second conductivity type and may not contain the emitter region of the second conductivity type.

According to an embodiment of the invention, the lateral semiconductor device is a MOS control thyristor.

Advantageously, the lateral MOS control thyristor comprises a first base region of the first conductivity type in a first portion of the well region, a first cathode region of the second conductivity type in the first base region, a second cathode region of the first conductivity type in the first cathode region, a second base region of the second conductivity type in a second portion of the well region, the second base region being spaced apart laterally from the first base region, an anode region of the first conductivity type above the second base region, the control electrode comprises a gate electrode fixed via a gate insulation film to portions of the first cathode region, the first base region and the well region, the portions extending between the second base region and the second cathode region, the second main electrode comprises a cathode electrode commonly contacting with the first and second cathode regions, and the first main electrode comprises an anode electrode on the anode region.

Alternatively, the base region of the second conductivity type may be expanded and the base region of the first conductivity type may be contained in a surface portion of the expanded base region of the second conductivity type.

Alternatively, the base region of the first conductivity type may be expanded and the base region of the second conductivity type may be contained in a surface portion of the expanded base region of the first conductivity type.

Alternatively, the well region of the first conductivity type may be such that it functions also as the base region of the first conductivity type, thereby to omit the base region of the first conductivity type.

Alternatively, the base region of the first conductivity type may contain the base region of the second conductivity type but not the emitter region of the second conductivity type.

Advantageously, the semiconductor region of the second conductivity type is a semiconductor layer of the second conductivity type formed above the semiconductor substrate of the first conductivity type.

Alternatively, the semiconductor region of the second conductivity type is in a surface portion of the semiconductor substrate of the first conductivity type.

Advantageously, the semiconductor region of the second conductivity type is a semiconductor layer of the second conductivity type above the semiconductor substrate of the first conductivity type, and the region of the second conductivity type is a sink layer extending from the auxiliary electrode to the semiconductor substrate of the first conductivity type, which sink layer is doped more heavily than the semiconductor layer of the second conductivity type. Preferably, this lateral semiconductor arrangement further includes a buried layer of the second conductivity type in a portion of a boundary between the semiconductor substrate of the first conductivity type and the semiconductor layer of the second conductivity type, which buried layer is doped more heavily than the semiconductor layer of the second conductivity type.

According to an embodiment of the invention, the semiconductor device further comprises a first region of one conductivity type making direct contact with the first main electrode, a buffer region of the other conductivity type surrounding the first region, the other conductivity type being opposite to the one conductivity type, a second region of the other conductivity type beneath the buffer region, and the buffer region being doped more heavily than the second region.

According to an embodiment of the invention, a method of using a lateral semiconductor arrangement including a semiconductor layer of a first conductivity type, a semiconductor region of a second conductivity type on the semiconductor layer, a well region of the first conductivity type in a surface portion of the semiconductor region, a first main electrode on the well region, a second main electrode on the well region, a control electrode above the well region, and an auxiliary electrode on the semiconductor region of the second conductivity type, which method includes a step of applying a bias potential to the auxiliary electrode, the bias potential being higher than the first and second main electrodes' potential.

According to another embodiment of the invention, a method of using a lateral semiconductor arrangement including a semiconductor layer of a first conductivity type, a semiconductor region of a second conductivity type on the semiconductor layer, a well region of the first conductivity type in a surface portion of the semiconductor region, a region of the second conductivity type in adjacent to the semiconductor region of a second conductivity type, a first main electrode on the well region, a second main electrode on the well region, and a control electrode above the well region, and an auxiliary electrode on the region of the second conductivity type, which method includes a step of applying a bias potential to the auxiliary electrode, the bias potential being higher than the first and second main electrodes' potential.

The functions of the foregoing means of the invention will be explained by way of an LIGBT. By disposing a p-type well in an n-type semiconductor region on a p-type substrate, p-type well region is between a p-type collector region and p-type substrate. Due to this arrangement, a parasitic pnp transistor does not operate and carriers do not accumulate in p-type substrate. Therefore, switching time is shortened. Disposing an auxiliary electrode on n-type semiconductor region or on an n-type region adjacent to n-type semiconductor region and connecting the auxiliary electrode at the same potential to a collector electrode of the LIGBT multiplies the effects of separating a p-type collector region from p-type substrate, thereby interrupting carrier injection from the collector electrode. As a result, a base current of the parasitic transistor is greatly reduced or completely interrupted, thereby suppressing the operation of the parasitic transistor. Therefore, the minority carrier is prevented from injection and accumulation into the semiconductor substrate of the first conductivity type.

The LIGBT's, in which the IGBT structure is formed in a base region of the first conductivity type on an expanded base region of the second conductivity type function in the similar manner. Also, LIGBT's, in which the IGBT structure is formed in the base region of the second conductivity type on an expanded base region of the first conductivity type functions in a similar manner.

Moreover, by widely expanding the base region of the first conductivity type to include the base region of the second conductivity type in its surface layer, the well region of the first conductivity type is omitted, thereby suppressing operation of the parasitic transistor. Since the parasitic transistor is suppressed, minority carrier injection and carrier accumulation in the semiconductor substrate of the first conductivity type are prevented.

In the lateral semiconductor arrangements in which the LIGBT is formed in the well region of the second conductivity type on the semiconductor substrate of the first conductivity, the auxiliary electrode on the well region of the second conductivity type is connected to the collector electrode. Biassing the auxiliary electrode and the collector electrode with the same potential prevents the carries injected from the collector electrode from accumulating in the semiconductor substrate of the first conductivity type.

A buried layer of the second conductivity type, formed between the semiconductor substrate of the first conductivity type and the semiconductor layer of the second conductivity type, is doped more heavily than the semiconductor layer.

The LIGBT's with the buried layer have also a sink layer of the second conductivity type, formed below the anode electrode. The sink layer, doped more heavily than the semiconductor layer, extends from the surface of the semiconductor layer to the buried layer, These buried and sink layers prevent punch-through caused by expansion of the depletion layer.

The contact region of the second conductivity type, disposed below the auxiliary electrode and doped more heavily than the semiconductor layer of the second conductivity type, lowers the contact resistance of the anode.

The buffer layer of the second conductivity type, surrounding the collector region of the first conductivity type and more heavily doped than the base region of the second conductivity type, prevents the depletion layer from expanding in the high withstand voltage LIGBT's.

A prefix "p-type" or "n-type" preceding a name of an element, such as a substrate, layer, or region indicates that the substrate, layer, or region contains acceptor type or donor type impurities.

The above, and other objects, features and advantages of the present invention will become apparent from the fol-

DETAILED DESCRIPTION OF THE PREFERRED EMBODIMENTS

First embodiment

Figure 1:
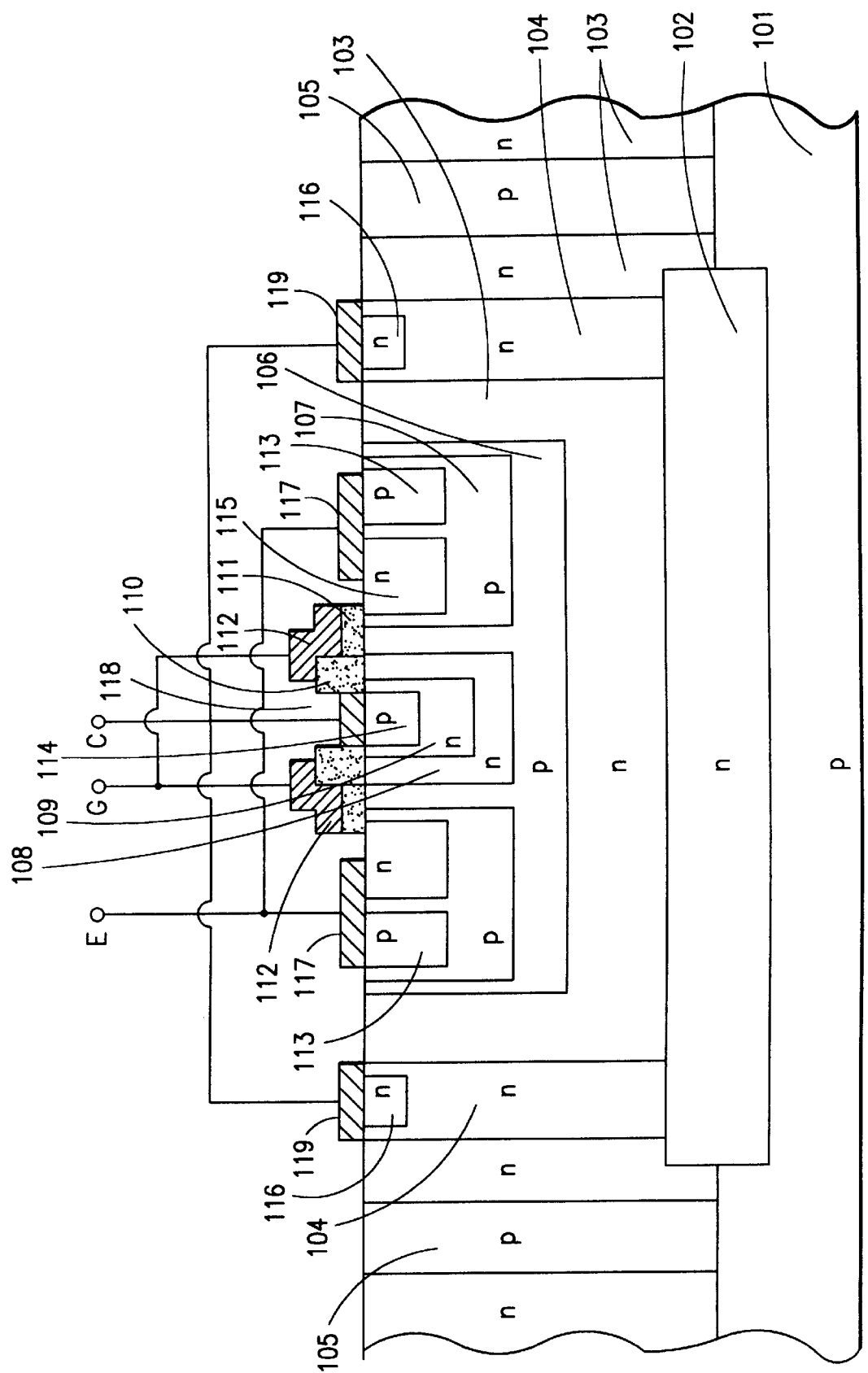
FIG. 1 is a cross section of a first embodiment of an LIGBT according to the present invention.

Referring to FIG. 1, an LIGBT according to the first embodiment includes a p-type substrate 101 having an n-type buried layer 102 formed thereon using any conventional method. An n-type epitaxial layer 103 is layered on buried layer 102. N-type buried layer 102 prevents a depletion layer from expanding between a p-type base region 107 and p-type substrate 101, thereby preventing punch-through from occurring, especially in high withstand voltage LIGBT's. An n-type sink layer 104, formed within n-type epitaxial layer 103, extends from a surface of n-type epitaxial layer 103 to n-type buried layer 102. N-type sink layer 104 prevents a depletion layer from expanding between p-type base region 107 and a p-type isolation layer 105, thereby preventing punch-through.

An n-type contact region 116 is formed in the surface layer of the n-type sink layer 104. An auxiliary electrode 119 is disposed on n-type contact region 116. P-type isolation layer 105, isolating a device area, extends from the surface of n-type epitaxial layer 103 to p-type substrate 101.

In order to form the LIGBT, a p-type well region 106 is disposed in a surface portion of n-type epitaxial layer 103. P-type base region 107 is then disposed in a surface portion of p-type well region 106. An n-type emitter region 115 and a p-type contact region 113 are formed in p-type base region 107.

An n-type base region 108 is also formed in a surface portion of p-type well region 106. N-type base region 108 is separated from p-type base region 107 by a portion of p-type well region 106. An n-type buffer region 109, more heavily doped than n-type epitaxial layer 103, is disposed in n-type base region 108. N-type buffer region 109 prevents n-type base region 108 from punching through, and is optionally omitted in some cases. A p-type collector region 114 is disposed in a surface portion of n-type buffer region 109.

An insulation film, such as a thick oxide film 110, is on a surface of n-type base region 108 and n-type buffer region 109. A polycrystalline silicon gate electrode 112 is fixed via an insulating film, such as a gate oxide film 111, to that portion of p-type well region 106 separating n-type base region 108 from p-type base region 107. Gate oxide film 111 and gate electrode 112 extend over a portion of p-type base region 107 between p-type well region 106 and n-type emitter region 115. Gate electrode 112 is connected to a gate terminal G.

Although p-type contact region 113 is shown completely included within p-type base region 107, p-type contact region 113 optionally is partly included within p-type base region 107. An emitter electrode 117 makes contact with n-type emitter region 115 and p-type contact region 113 in common. Emitter electrode 117 is connected to an emitter terminal E.

A collector electrode 118, connected to a collector terminal C, is on p-type collector region 114. An inter-layer insulation film, metal wiring, passivation film, or other such material is optionally formed.

A voltage, higher than the threshold voltage and positive with respect to a potential of emitter electrode 117, is applied to gate electrode 112. The applied voltage creates an inversion layer in a surface layer of p-type base regions 107, and p-type well region 106 beneath gate electrode 112. Electrons flow from n-type emitter region 115 into n-type base region 108 through the inversion layer where they are collected by collector region 114. As a result, the electron current functions as a base current of a pnp transistor consisting of p-type collector region 114, n-type buffer region 109 and n-type base region 108, and p-type base region 107.

The base current turns on the pnp transistor, causing conductivity modulation and a large current between the terminals C and E. As mentioned above, n-type buried layer 102 and n-type sink layer 104 prevent depletion layers from expanding between p-type base region 107 and p-type substrate 101 and between p-type base region 107 and p-type isolation layer 105, thereby preventing punch-through from occurring, especially in high withstand-voltage LIGBT's. P-type contact region 113 and n-type contact region 116 lower a contact resistance of emitter electrode 117 and auxiliary electrode 119.

N-type sink layer 104 and n-type buried layer 102 surrounding the LIGBT are biased at the same potential. Therefore, a parasitic pnp transistor, with p-type substrate 101 or p-type isolation layer 105 as its collector, remains off, thereby avoiding the problems of the prior art. As a result, carriers accumulated in p-type substrate 101 are greatly decreased, shortening a turn-off time and reducing switching loss to one-tenth of the prior art.

Although the embodiments are explained by way of devices which include an n-type well region formed by impurity diffusion within a p-type substrate, n-type epitaxial layer is optionally disposed in an area isolated by p-type isolation layers. For example, an n-type well region formed by impurity diffusion may substitute for n-type epitaxial layer 103 of FIG. 1.

In the first embodiment shown in FIG. 1, n-type emitter region 115 and other elements are symmetrically arranged with respect to p-type collector region 114. This sort of symmetrical structure is often employed, especially in switching on and off a large current, due to electrical and thermal balances. The embodiments shown in FIGS. 4–23 show basic asymmetric structures for simplicity.

Second embodiment

Figure 2:
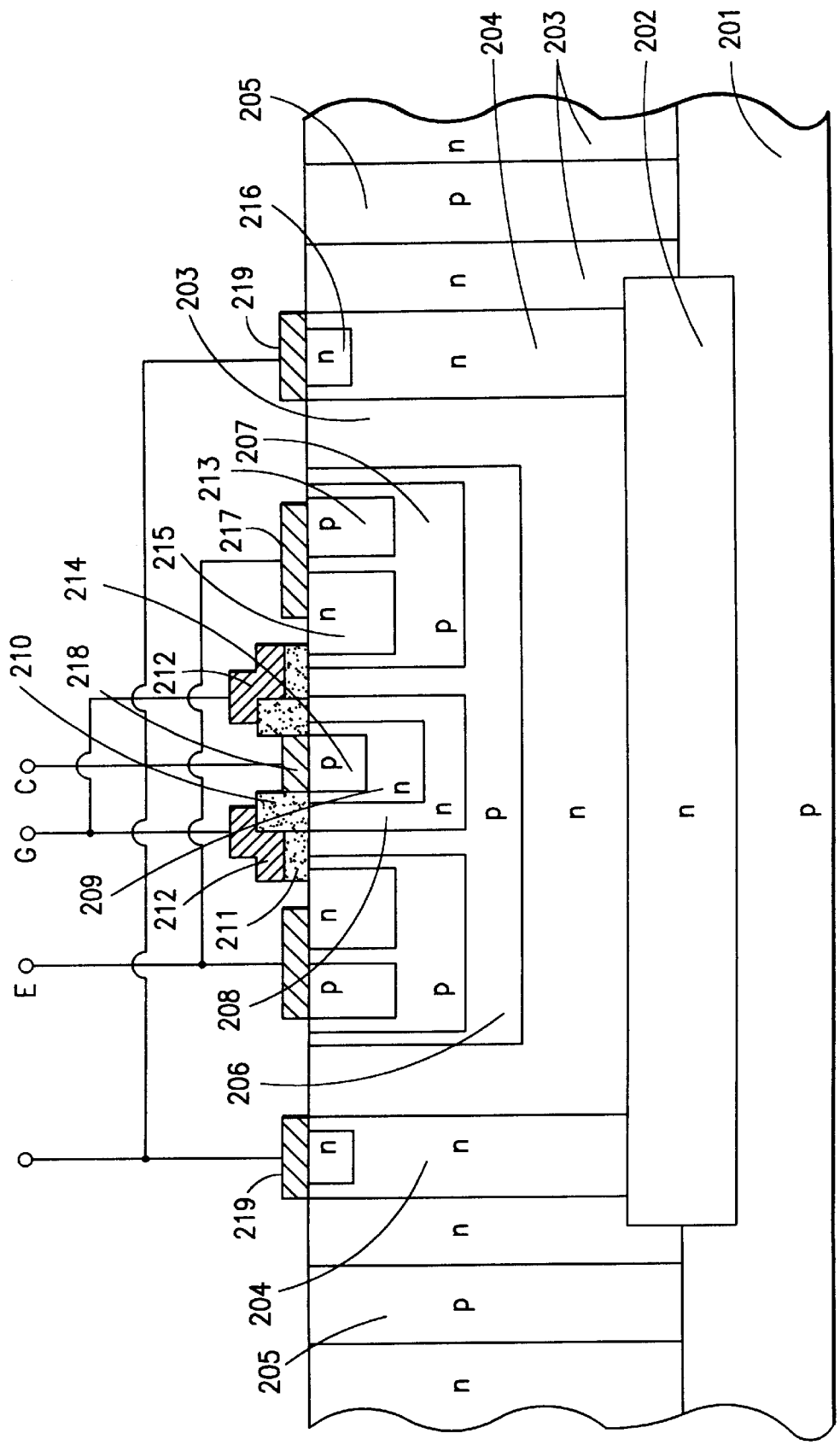
FIG. 2 is a cross section of a second embodiment of an LIGBT according to the present invention.

Referring to FIG. 2, an LIGBT according to the second embodiment is a modification of the first embodiment. The LIGBT includes a p-type substrate 201 having an n-type buried layer 202 formed thereon using any conventional method. An n-type epitaxial layer 203 is layered on buried layer 202. N-type buried layer 202 prevents a depletion layer from expanding between a p-type base region 207 and p-type substrate 201, thereby preventing punch-through from occurring, especially in high withstand voltage LIGBT's. An n-type sink layer 204, formed within n-type epitaxial layer 203, extends from a surface of n-type epitaxial layer 203 to n-type buried layer 202. N-type sink layer 204 prevents a depletion layer from expanding between p-type base region 207 and a p-type isolation layer 205, thereby preventing punch-through.

An n-type contact region 216 is formed in the surface layer of the n-type sink layer 204. An auxiliary electrode 219 is disposed on n-type contact region 216. P-type isolation layer 205, isolating a device area, extends from the surface of n-type epitaxial layer 203 to p-type substrate 201.

In order to form the LIGBT, a p-type well region 206 is disposed in a surface portion of n-type epitaxial layer 203. P-type base region 207 is then disposed in a surface portion of p-type well region 206. An n-type emitter region 215 and a p-type contact region 213 are formed in p-type base region 207.

An n-type base region 208 is also formed in a surface portion of p-type well region 206. N-type base region 208 is separated from p-type base region 207 by a portion of p-type well region 206. An n-type buffer region 209, more heavily doped than n-type epitaxial layer 203, is disposed in n-type base region 208. N-type buffer region 209 prevents n-type base region 208 from punching through, and is optionally omitted in some cases. A p-type collector region 214 is disposed in a surface portion of n-type buffer region 209.

An insulation film, such as a thick oxide film 210, is on a surface of n-type base region 208 and n-type buffer region 209. A polycrystalline silicon gate electrode 212 is fixed via an insulating film, such as a gate oxide film 211, to that portion of p-type well region 206 separating n-type base region 208 from p-type base region 207. Gate oxide film 211 and gate electrode 212 extend over a portion of p-type base region 207 between p-type well region 206 and n-type emitter region 215. Gate electrode 212 is connected to a gate terminal G.

Although p-type contact region 213 is shown completely included within p-type base region 207, p-type contact region 213 optionally is partly included within p-type base region 207. An emitter electrode 217 makes contact with n-type emitter region 215 and p-type contact region 213 in common. Emitter electrode 217 is connected to an emitter terminal E.

A collector electrode 218, connected to a collector terminal C, is on p-type collector region 214. An inter-layer insulation film, metal wiring, passivation film, or other such material is optionally formed.

The second embodiment has an almost similar structure to that of the first embodiment except that auxiliary electrode 219 is not connected to collector electrode 218. Auxiliary electrode 219 is preferably biased by an independent power supply to a higher potential than collector electrode 218. The biased potential of auxiliary electrode 219 boosts potentials of n-type epitaxial layer 203, n-type buried layer 202, and n-type sink layer to prevent carrier injection into p-type substrate 201 and p-type isolation layer 205.

Therefore, a pnp parasitic transistor which uses p-type substrate 201 as its collector remains off. As a result, problems of the prior art are avoided. Switching loss is greatly reduced by this embodiment similarly as in the first embodiment. The device of the second embodiment is turned on and off by applying a voltage to gate electrode 212 similarly as in the first embodiment.

Third embodiment

Figure 3:
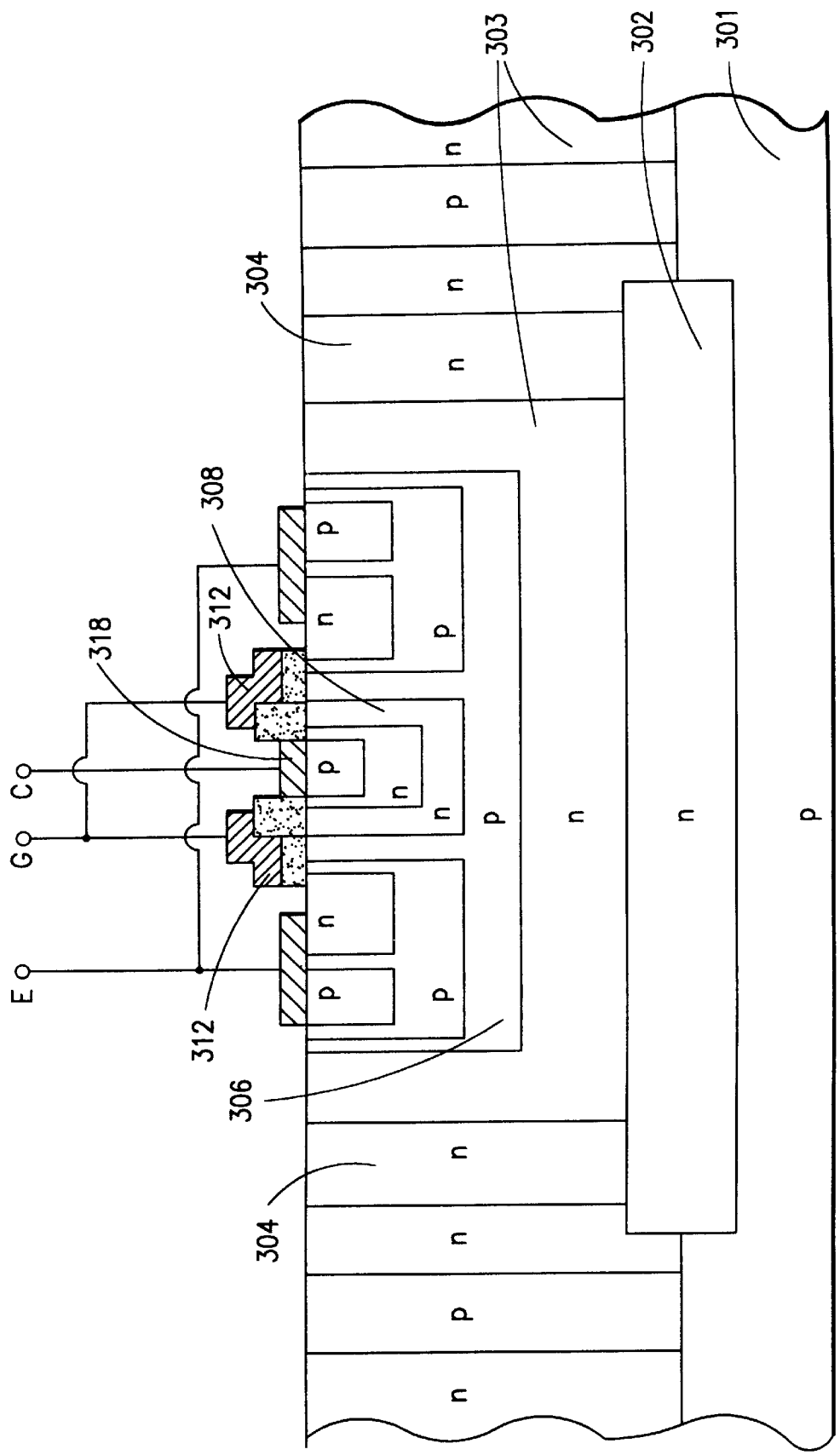
FIG. 3 is a cross section of a third embodiment of an LIGBT according to the present invention.

Referring to FIG. 3, an LIGBT according to the third embodiment of the present invention is shown. Since the third embodiment is a modification of the first embodiment, discussion of the structural similarities is omitted. The third embodiment has an almost similar structure to that of the first embodiment except for the absence of an n-type contact region (reference numeral 216 in FIG. 2) and an auxiliary electrode (reference numeral 219 in FIG. 2) on the n-type contact region. Therefore, an n-type epitaxial layer 303 on a p-type substrate 301 is not connected to a collector electrode 318. A potential of n-type epitaxial layer 303 is floated.

The device of the third embodiment is turned on and off by applying a voltage to a gate electrode 312 similarly as in the first embodiment. In the OFF-state, a depletion layer expands from a p-n junction between an n-type base region 308 and a p-type well region 306. When the depletion layer reaches n-type epitaxial layer 303, potentials of n-type epitaxial layer 303, an n-type buried layer 302, and an n-type sink layer 304 rise relative to a potential of collector electrode 318. Therefore, a junction between n-type buried layer 302 and p-type substrate 301 determines the withstand voltage of the third embodiment.

Since n-type buried layer 302 is only partially depleted in an ON state of the device, carriers are not injected into p-type substrate 301, thereby leaving a pnp parasitic transistor which uses p-type substrate 301 as its collector OFF. As a result, problems of the prior art are avoided. Switching loss is greatly reduced by this embodiment similarly as in the first embodiment.

Fourth embodiment

Figure 4:
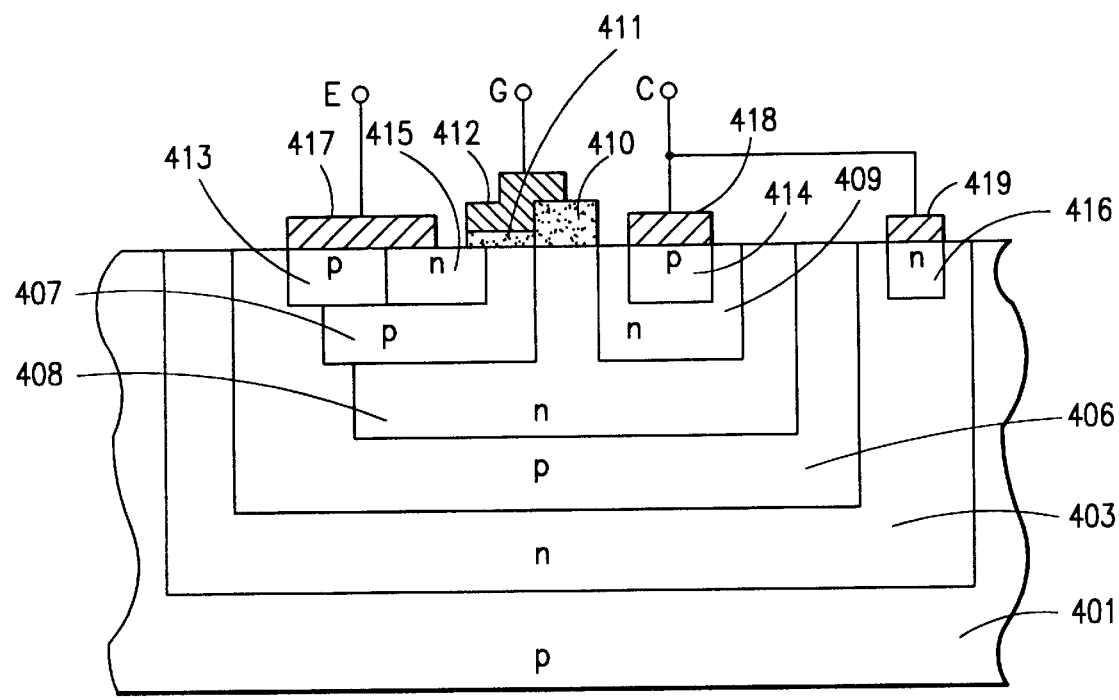
FIG. 4 is a cross section of a fourth embodiment of an LIGBT according to the present invention.

Referring to FIG. 4, an LIGBT according to the fourth embodiment of the present invention, includes a p-type substrate 401 on which an n-type well region 403 is formed. N-type well region 403 is preferably formed by diffusing impurity ions in a surface portion of p-type substrate 401. A p-type well region 406 is formed in a surface portion of n-type well region 403. An n-type base region 408 is disposed in a surface portion of p-type well region 406. A p-type base region 407 is disposed in a corner of n-type base region 408. An n-type emitter region 415 is disposed in a surface portion of p-type base region 407. A p-type contact region 413 is disposed in a corner of p-type base region 407 adjacent to n-type emitter region 415.

An n-type buffer region 409 is disposed in a surface portion of n-type base region 408, separated from p-type base region 407 by a portion of n-type base region 408. N-type base region 409 is doped more heavily than n-type base region 408. A p-type collector region 414 is disposed within n-type buffer region 409. An n-type contact region 416 is disposed within a surface portion of n-type well region 403. An auxiliary electrode 419 is disposed on n-type contact region 416.

An insulating film, such as a thick oxide film 410, extends onto a portion of n-type base region 408 between p-type base region 407 and n-type buffer region 409. A gate electrode 412 is fixed via an insulating film, such as a gate oxide film 411, to a portion of p-type base region 407 between n-type base region 408 and n-type emitter region 415. Gate electrode 412 is connected to a gate terminal G. An emitter electrode 417 makes common contact with n-type emitter region 415 and p-type contact region 413. Emitter electrode 417 is connected to an emitter terminal E. A collector electrode 418, connected to a collector terminal C, is on p-type collector region 414. An inter-layer insulation film, metal wiring, passivation film, or other such material is optionally formed.

The device of FIG. 4 operates in a manner similar to the device of FIG. 1. A signal voltage applied to gate electrode 412 flows or interrupts a current between collector electrodes 418 and emitter electrode 417.

N-type well region 403 in p-type substrate 401 is electrically connected to p-type collector region 414 via n-type contact region 416. Due to this electrical connection, a parasitic pnp transistor with p-type substrate 401 as its collector remains OFF. As a result, problems of the prior art are avoided. Switching loss is greatly reduced by this embodiment similarly as in the first embodiment.

N-type well region 403 of the fourth embodiment is preferably formed by impurity diffusion instead of epitaxial growth. Alternatively, n-type well region 403 is in an n-type epitaxial layer formed by epitaxial growth in an area isolated by p-type isolation layers as shown in FIG. 1. As shown in FIG. 4, n-type base region 408 extends to contain a part of p-type base region 407. Alternatively, n-type base region 408 entirely contains p-type base region 407. In another alternative, p-type base region 407 entirely contains p-type contact region 413. An LIGBT which includes these alternative modifications operates similar to the unmodified embodiment of FIG. 4.

In the arrangement of FIG. 4, auxiliary electrode 419 is optionally not connected to collector electrode 418, thereby biasing auxiliary electrode 419 at a high potential. Alternatively, auxiliary electrode 419 is omitted, thereby floating the potential of n-type well region 403.

Fifth embodiment

Figure 5:
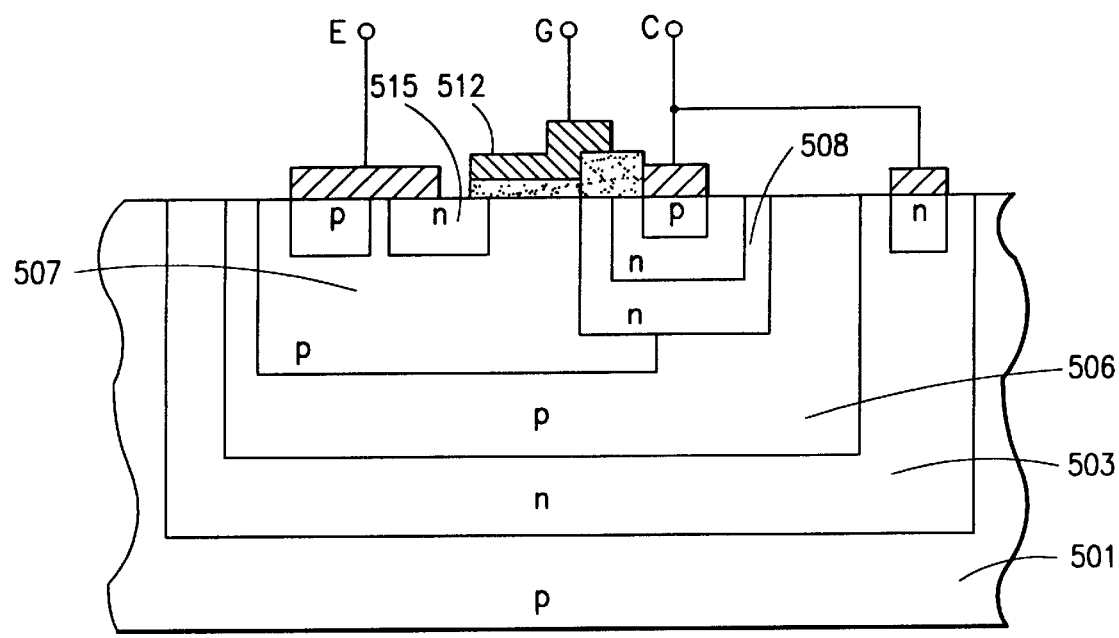
FIG. 5 is a cross section of a fifth embodiment of an LIGBT according to the present invention.

Referring to FIG. 5, an LIGBT according to a fifth embodiment of the present invention a p-type substrate 501 which contains an n-type well region 503 in its surface portion. A p-type well region 506 is disposed in a surface portion of n-type well region 503. An LIGBT is formed in a surface portion of p-type well region 506. A p-type base region 507 is disposed in p-type well region 506. The fifth embodiment differs from the first embodiment in that an n-type base region 508 is formed in a surface portion of p-type base region 507 in the fifth embodiment instead of in a p-type well region (reference numeral 106 in FIG. 1) as in the first embodiment. A gate electrode 512 is therefore only above p-type base region 507, since p-type well region 506 is not between n-type base region 508 and an n-type emitter region 515. Since the fifth embodiment operates similar to the first and second embodiments, further description is omitted. The fifth embodiment greatly facilitates reducing the switching loss as do the foregoing embodiments.

Sixth embodiment

Figure 6:
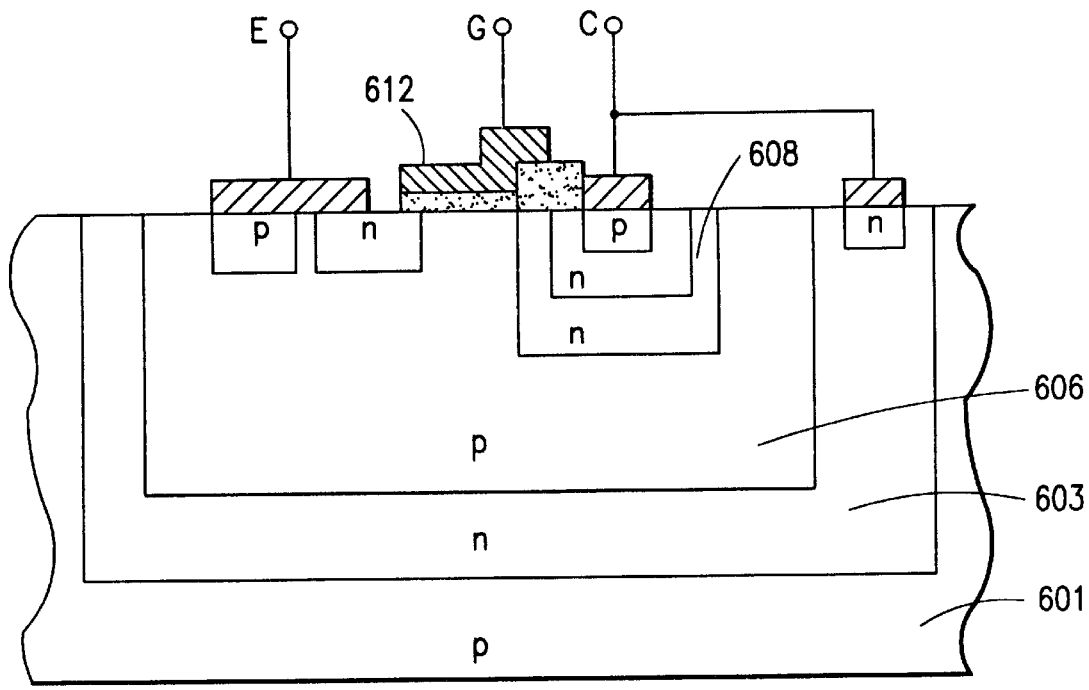
FIG. 6 is a cross section of a sixth embodiment of an LIGBT according to the present invention.

Referring to FIG. 6, an LIGBT according to a sixth embodiment of the present invention includes a p-type substrate 601 which contains an n-type well region 603 disposed in its surface portion. A p-type well region 606 is disposed in a surface portion of n-type well region 603. An LIGBT similar to that of the fifth embodiment is disposed in a surface portion of n-type epitaxial layer 603. The sixth embodiment differs from the fifth embodiment in that the p-type base region 507 of FIG. 5 is considered to be either omitted or enlarged enough to overlap p-type well region 606 and entirely contain an n-type base region 608. A gate electrode 612 is above p-type well region 606.

Seventh embodiment

Figure 7:
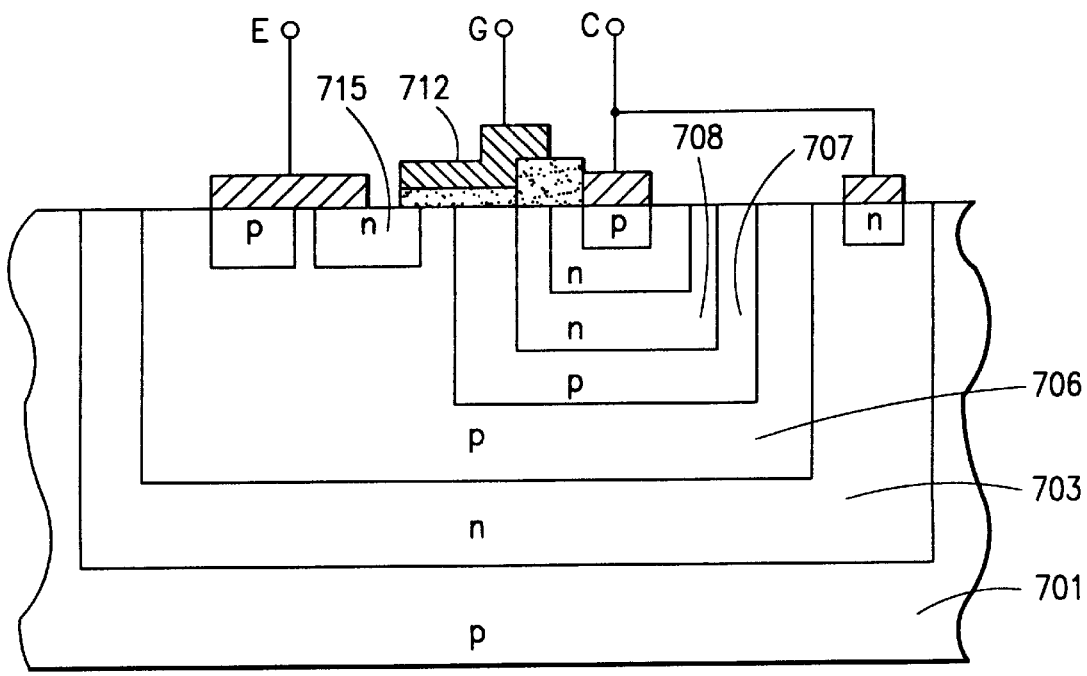
FIG. 7 is a cross section of a seventh embodiment of an LIGBT according to the present invention.

Referring to FIG. 7, an LIGBT according to a seventh embodiment of the present invention includes a p-type substrate 701 which contains an n-type well region 703 disposed in its surface portion. A p-type well region 706 is disposed in a surface portion of n-type well region 703. An LIGBT similar to that of the fifth embodiment is disposed in a surface portion of n-type epitaxial layer 703. The seventh embodiment differs from the sixth embodiment in that a p-type base region 707, within p-type well region 706, is formed to include an n-type base region 708. Unlike the fifth embodiment, p-type base region 707 (507 in FIG. 5) does not include an n-type emitter region 715 (515 in FIG. 5). A gate electrode 712 is above p-type base region 707 and a surface of p-type well region 706.

The devices of FIGS. 6 and 7 operate similarly to the other devices described earlier, greatly reducing switching loss as do the other devices.

N-type well regions 503, 603 or 703, formed by impurity diffusion, of FIGS. 5, 6 or 7, respectively, are optionally replaced by an n-type epitaxial layer formed by epitaxial growth. In the arrangements of FIG. 5, 6 or 7, the auxiliary electrode is optionally not connected to the collector electrode, as in the second and third embodiments, thereby biasing the auxiliary electrode at a high potential. Alternatively, the auxiliary electrode is omitted, thereby floating the potential of the n-type well region.

Although the present invention has been explained so far by way of n-channel LIGBT's, it is apparent to one skilled in the art that the present invention is also applicable to p-channel LIGBT's that includes semiconductor regions of the opposite conductivity type to that of the semiconductor regions of the n-channel LIGBT's.

Now the present invention is applied to semiconductor devices other than IGBT's.

Eighth embodiment

Figure 8:
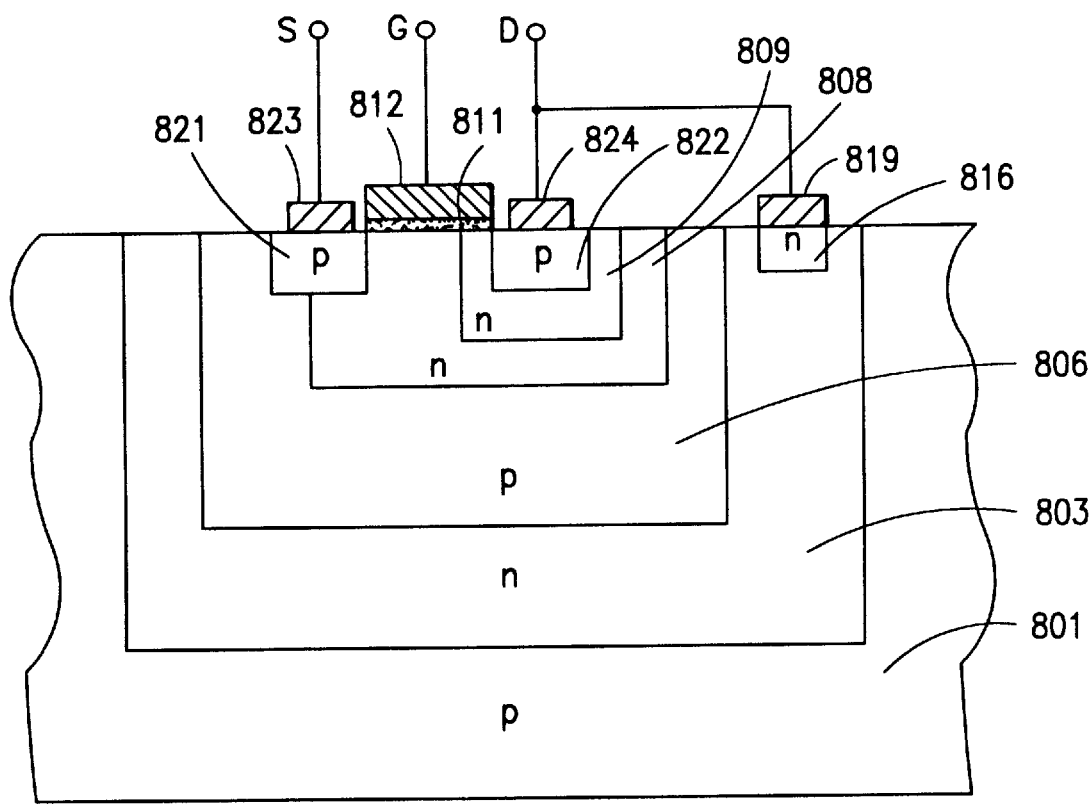
FIG. 8 is a cross section of an eighth embodiment, an LMOSFET, according to the present invention.

Referring to FIG. 8, a lateral metal oxide semiconductor field effect transistor (hereinafter referred to as an "LMOSFET") according to an eighth embodiment includes a p-type substrate 801. P-type substrate 801 contains an n-type well region 803 preferably formed in its surface portion by impurity ion implantation and subsequent diffusion. A p-type well region 806 is disposed in a surface portion of n-type well region 803. An n-type base region 808 is disposed in a surface portion of p-type well region 806. A p-type source region 821 is disposed in a first surface portion of n-type base region 808. An n-type buffer region 809 containing a p-type drain region 822 is disposed in a second surface portion of n-type base region 808. The first and second surface portions are separated apart from each other.

An n-type contact region 816 is formed in a surface portion of n-type well region 803. A gate electrode 812 is fixed via an insulating film, such as a gate oxide film 811, to the portions of n-type base region 808 and n-type buffer region 809 separating p-type source region 821 from p-type drain region 822. Gate electrode 812 is connected to a gate terminal G. A source electrode 823 is on p-type source region 821. Source electrode 823 is connected to a source terminal S. A drain electrode 824 is on p-type drain region 822. Drain electrode 824 is connected to a drain terminal D. An auxiliary electrode 819 is on n-type contact region 816. An inter-layer insulation film, metal wiring, passivation film, or other such material is optionally formed.

A voltage, higher than a threshold voltage and negative with respect to a potential of source electrode 823, is applied to gate electrode 812. The applied voltage creates an inversion layer in a surface layer of n-type base region 808 beneath gate electrode 812. Source electrode 823 and drain electrode 824 are electrically connected via the created inversion layer through which electrons flow. There exists a parasitic diode consisting of p-type drain region 822, n-type buffer region 809, and n-type base region 808. In conventional devices, holes which leak to an n-type base region accumulate in a p-type substrate, thereby increasing switching loss.

In the eighth embodiment, n-type well region 803 in p-type substrate is electrically connected to p-type drain region 822 via n-type contact region 816. Due to this electric connection, the pnp parasitic transistor having p-type substrate 801 as its collector remains OFF. As a result, problems of the prior art are avoided. Switching loss is greatly reduced by this embodiment as in the foregoing embodiments of LIGBT's.

Ninth embodiment

Figure 9:
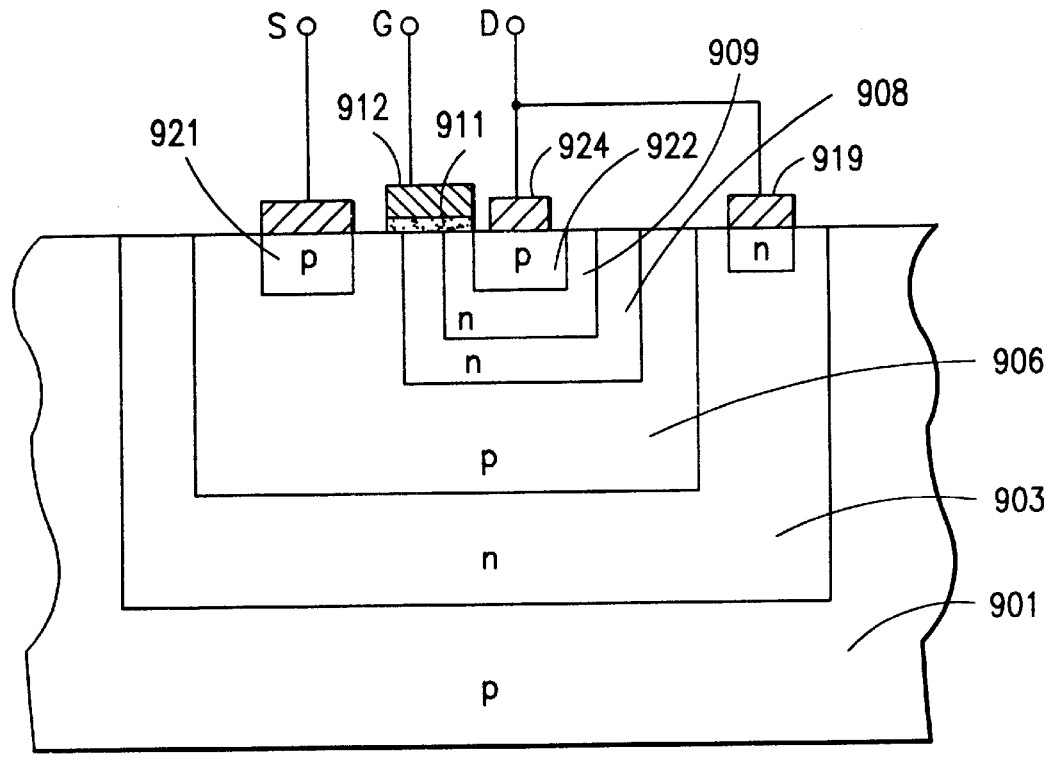
FIG. 9 is a cross section of a ninth embodiment, an LMOSFET, according to the present invention.

Referring to FIG. 9, an LMOSFET according to a ninth embodiment of the present invention is shown. The ninth embodiment includes a p-type substrate 901 containing an n-type well region 903 in its surface portion. A p-type well region 906 is disposed in a surface portion of n-type well region 903. An LMOSFET similar to that of the eighth embodiment is disposed in a surface portion of n-type well region 903. The ninth embodiment differs from the eighth embodiment in that a p-type source region 921 is disposed entirely in a surface portion of p-type well region 906. A gate electrode 912 is above a surface portion of an n-type base region 908 and an n-type buffer region 909 separating p-type well region 906 from a p-type drain region 922.

The device of FIG. 9 operates similar to the eighth embodiment as described above, thereby greatly reducing switching loss.

N-type well regions 803 and 903 are optionally replaced by an n-type epitaxial layer. In the arrangement of FIGS. 8 and 9, auxiliary electrodes 819, 919 on collector regions 816, 916 are optionally not connected to drain electrodes 824, 924, thereby biasing the auxiliary electrode at a high potential. The auxiliary electrode is optionally omitted, thereby floating the potential of n-type well region. These modifications neither change the operations of the LMOSFET's nor impair their merits.

Tenth embodiment

Figure 10:
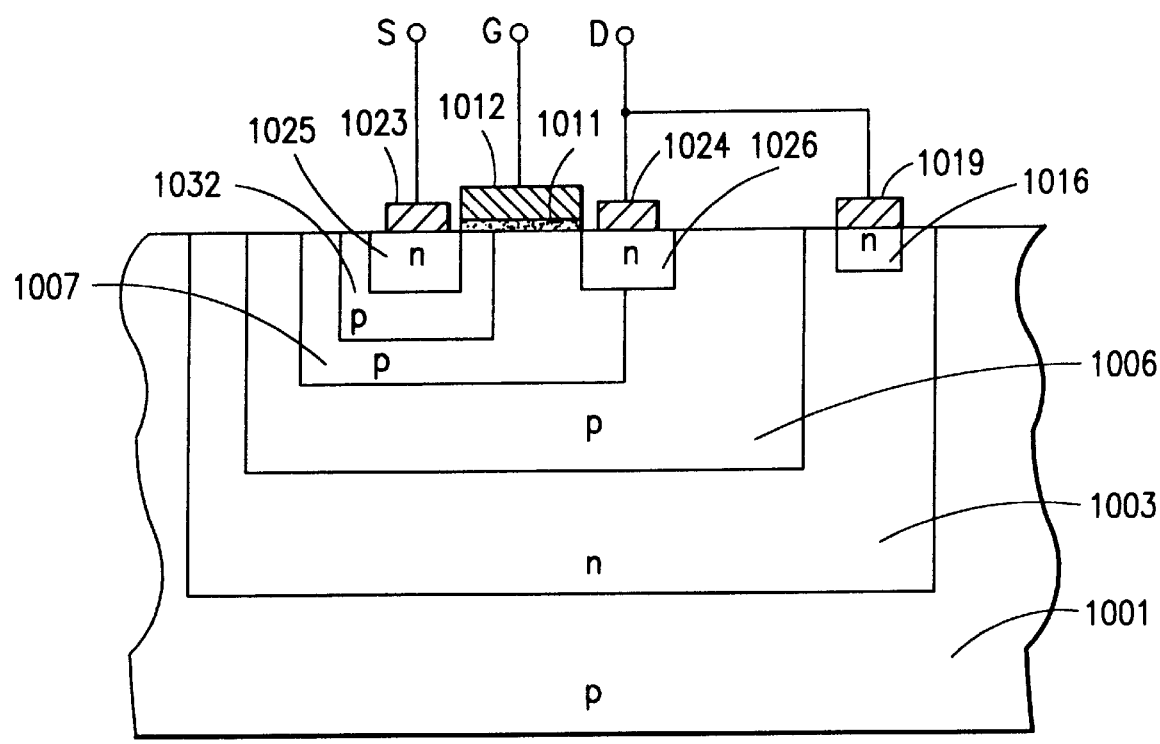
FIG. 10 is a cross section of a tenth embodiment, an LMOSFET, according to the present invention.

Referring to FIG. 10, an LMOSFET integrated into a power IC according to a tenth embodiment is shown. The tenth embodiment includes a p-type substrate 1001 containing in its surface portion an n-type well region 1003 preferably formed by impurity ion implantation and subsequent diffusion. A p-type well region 1006 is disposed in a surface portion of n-type well region 1003. A p-type base region 1007 is disposed in a surface portion of p-type well region 1006. An n-type drain region 1026 is disposed in a first surface portion of p-type base region 1007. A p-type buffer region 1032 containing an n-type source region 1025 is disposed in a second surface portion of p-type base region 1007. The first and second surface portions are separated apart from each other.

An n-type contact region 1016 is formed in a surface portion of n-type well region 1003. A gate electrode 1012 is fixed via an insulating film, such as a gate oxide film 1011, to the portions of p-type base region 1007 and p-type buffer region 1032 separating n-type source region 1025 from n-type drain region 1026. Gate electrode 1012 is connected to a gate terminal G. A source electrode 1023 is on n-type source region 1025. Source electrode 1023 is connected to a source terminal S. A drain electrode 1024, on n-type drain region 1026, is connected to a drain terminal D. An auxiliary electrode 1019 is on n-type contact region 1016. An inter-layer insulation film, metal wiring, passivation film, or other such material is optionally formed.

A voltage, higher than a threshold voltage and negative with respect to a potential of source electrode 1023, is applied to gate electrode 1012. The applied voltage creates an inversion layer in a surface layer of p-type base region 1007 and p-type buffer region 1032 beneath gate electrode 1012. Source electrode 1023 and drain electrode 1024 are electrically connected via the created inversion layer through which electrons flow from n-type source region 1025 to n-type drain region 1026.

Although the carriers which contribute to conduction in the device of this embodiment are electrons instead of holes, some holes are ejected when an inversion layer is created by a voltage applied to gate electrode 1012 since the device is an n-channel MOSFET. These holes sometimes flow to p-type substrate 1001, the collector of the parasitic pnp transistor. However, since n-type well region 1003 is electrically connected to n-type drain region 1026 via n-type contact region 1016, these holes are never injected into p-type substrate 1001 by the parasitic pnp transistor. Thus, problems of the prior art are avoided, and switching loss is greatly reduced by this embodiment.

P-type base region 1007 optionally does not contain n-type drain region 1026. P-type base region 1007 is optionally omitted by carefully setting the impurity concentration or similar parameter of p-type well region 1003. These modifications neither change the operations of the LMOSFET's nor impair their merits.

Eleventh embodiment

Figure 11:
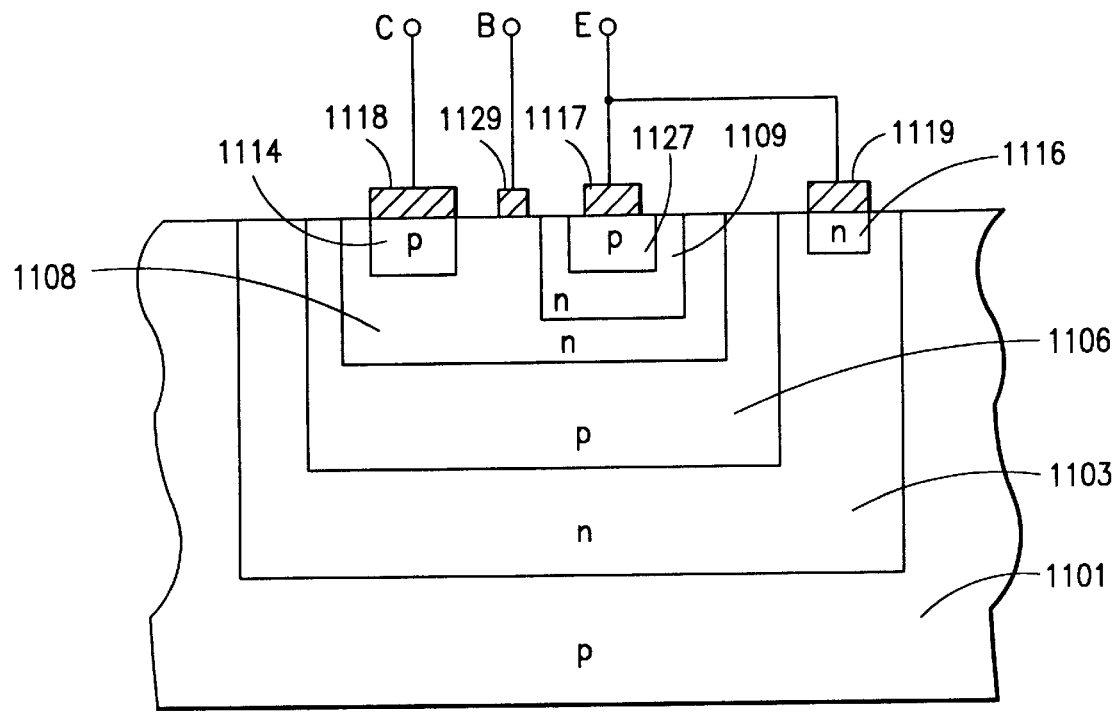
FIG. 11 is a cross section of an eleventh embodiment, a lateral bipolar transistor, according to the present invention.

Referring to FIG. 11, a lateral bipolar transistor integrated into a power IC according to an eleventh embodiment is shown. The eleventh embodiment includes a p-type substrate 1101 containing in its surface portion an n-type well region 1103 preferably formed by impurity ion implantation and subsequent diffusion. A p-type well region 1106 is disposed in a surface portion of n-type well region 1103. An n-type base region 1108 is disposed in a surface portion of p-type well region 1106. A p-type collector region 1114 is disposed in a first surface portion of n-type base region 1108. An n-type buffer region 1109 containing a p-type emitter region 1127 is disposed in a second surface portion of n-type base region 1108. The first and second surface portions are separated apart from each other.

An n-type contact region 1116 is formed in a surface portion of n-type well region 1103. A base electrode 1129 on n-type base region 1108 is connected to a base terminal B. An emitter electrode 1117 on p-type emitter region 1127 is connected to an emitter terminal E. A collector electrode 1118 on p-type collector region 1114 is connected to a collector terminal C. An auxiliary electrode 1119 is on n-type contact region 1116. An inter-layer insulation film, metal wiring, passivation film, or other such material may be optionally formed.

In this device, a base current flowing from emitter electrode 1117 to base electrode 1129 injects a large amount of holes from p-type emitter region 1127 into n-type base region 1108, thereby electrically connecting emitter electrode 1117 to collector electrode 1118.

In this embodiment, n-type well region 1103 in p-type substrate 1101 is electrically connected to p-type emitter region 1127 via n-type contact region 1116. Due to this electrical connection, a pnp parasitic transistor having p-type substrate 1101 as its collector remains OFF all the time. Therefore, problems of the prior art are avoided, and switching loss is greatly reduced by this embodiment.

Twelfth embodiment

Figure 12:
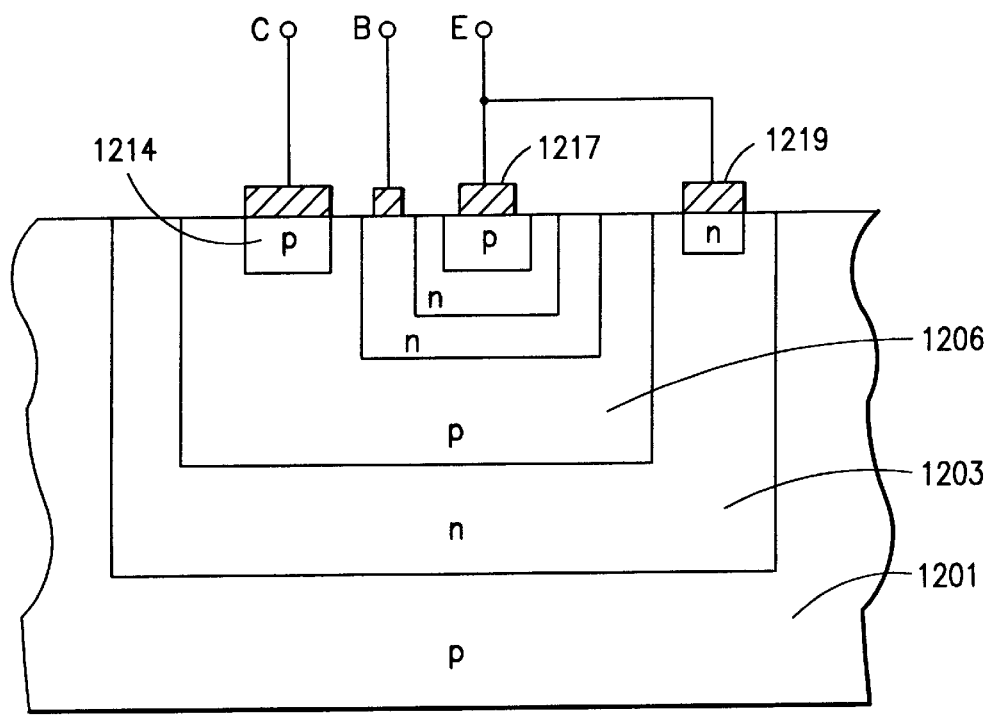
FIG. 12 is a cross section of a twelfth embodiment, a lateral bipolar transistor, according to the present invention.

Referring to FIG. 12, a lateral bipolar transistor according to a twelfth embodiment of the present invention is shown. This arrangement includes a p-type substrate 1201 containing an n-type well region 1203 in its surface portion. A p-type well region 1206 is disposed in a surface portion of n-type well region 1203. A lateral bipolar transistor similar to that of FIG. 11 is formed in a surface portion of n-type well region 1203. The device of FIG. 12 differs from the device of FIG. 11 in that a p-type collector region 1214 is disposed in a surface portion of p-type well region 1206 instead of p-type collector region 1114 being within n-type base region 1108 as shown in FIG. 11. This device operates similar to the forgoing embodiment to obtain the same effects and greatly lower switching loss.

In the arrangement of FIGS. 11 and 12, auxiliary electrodes 1119 and 1219 are optionally not connected to emitter electrodes 1117 and 1217, as similar to the first and second embodiments, thereby biasing the auxiliary electrodes at a high potential. The auxiliary electrodes are optionally omitted from n-type well regions 1103 and 1203, thereby floating the potential of the n-type well region.

Thirteenth embodiment

Figure 13:
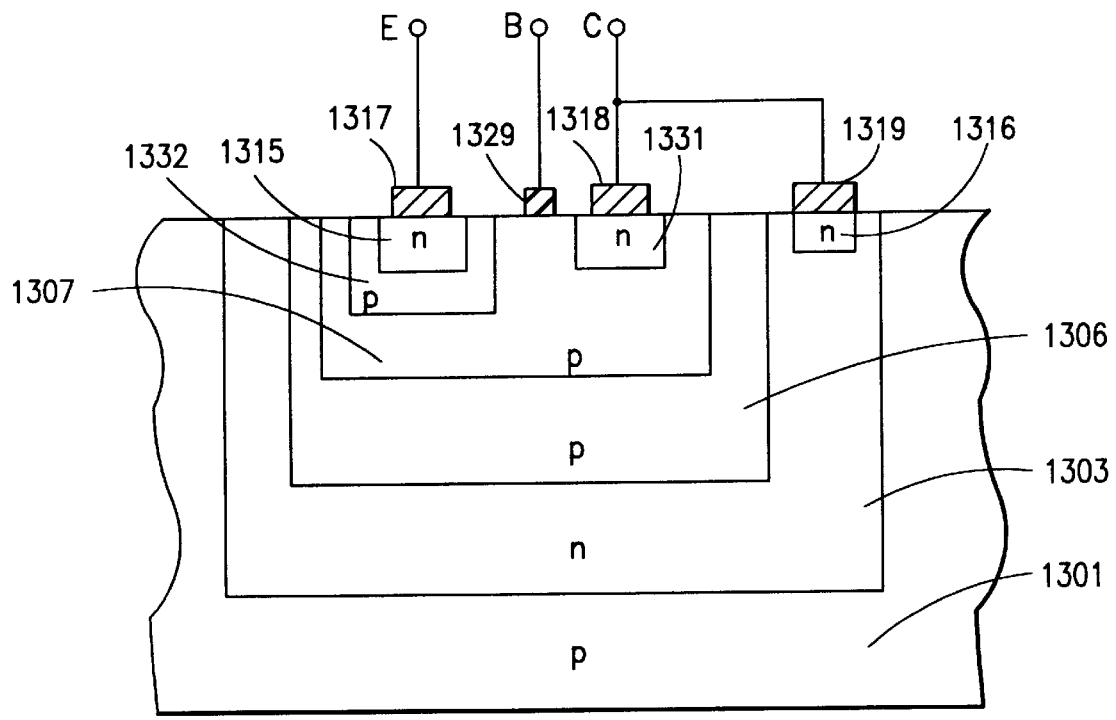
FIG. 13 is a cross section of a thirteenth embodiment, a lateral bipolar transistor, according to the present invention.

Referring to FIG. 13, a lateral bipolar transistor integrated into a power IC according to a thirteenth embodiment is shown. This embodiment includes a p-type substrate 1301 containing in its surface portion an n-type well region 1303 preferably formed by impurity ion implantation and subsequent diffusion. A p-type well region 1306 is disposed in a surface portion of n-type well region 1303. A p-type base region 1307 is disposed in a surface portion of p-type well region 1306. An n-type collector region 1331 is disposed in a first surface portion of p-type base region 1307. A p-type buffer region 1332 containing an n-type emitter region 1315 is disposed in a second surface portion of p-type base region 1307. The first and second surface portions are separated apart from each other.

An n-type contact region 1316 is formed in a surface portion of n-type well region 1303. A base electrode 1329 on p-type base region 1307 is connected to a base terminal B. An emitter electrode 1317 on n-type emitter region 1315 is connected to an emitter terminal E. A collector electrode 1318 on n-type collector region 1331 is connected to a collector terminal C. An auxiliary electrode 1319 is on n-type contact region 1316. An inter-layer insulation film, metal wiring, passivation film, or other such material are optionally formed.

In this device, a base current from base electrode 1329 to emitter electrode 1317 injects a large amount of electrons from n-type emitter region 1315 to p-type base region 1307, thereby electrically connecting emitter electrode 1317 to collector electrode 1318.

In this embodiment, n-type well region 1303 in p-type substrate 1301 is electrically connected to n-type collector region 1331 via n-type contact region 1316. Due to this electrical connection, a pnp parasitic transistor never injects the majority carrier, electrons in p-type base region 1307, to p-type substrate 1301. Therefore, the device of FIG. 13 greatly lowers switching loss as do the foregoing devices.

P-type base region 1307 optionally does not contain n-type collector region 1331. Alternatively, p-type base region 1307 optionally contains n-type collector region 1331 only. P-type base region 1307 is optionally omitted by carefully setting the impurity concentration or similar parameter of p-type well region 1303. P-type buffer region 1332 is also optional. These modifications neither change the operation of the lateral bipolar transistor nor impair its merit.

Fourteenth embodiment

Figure 14:
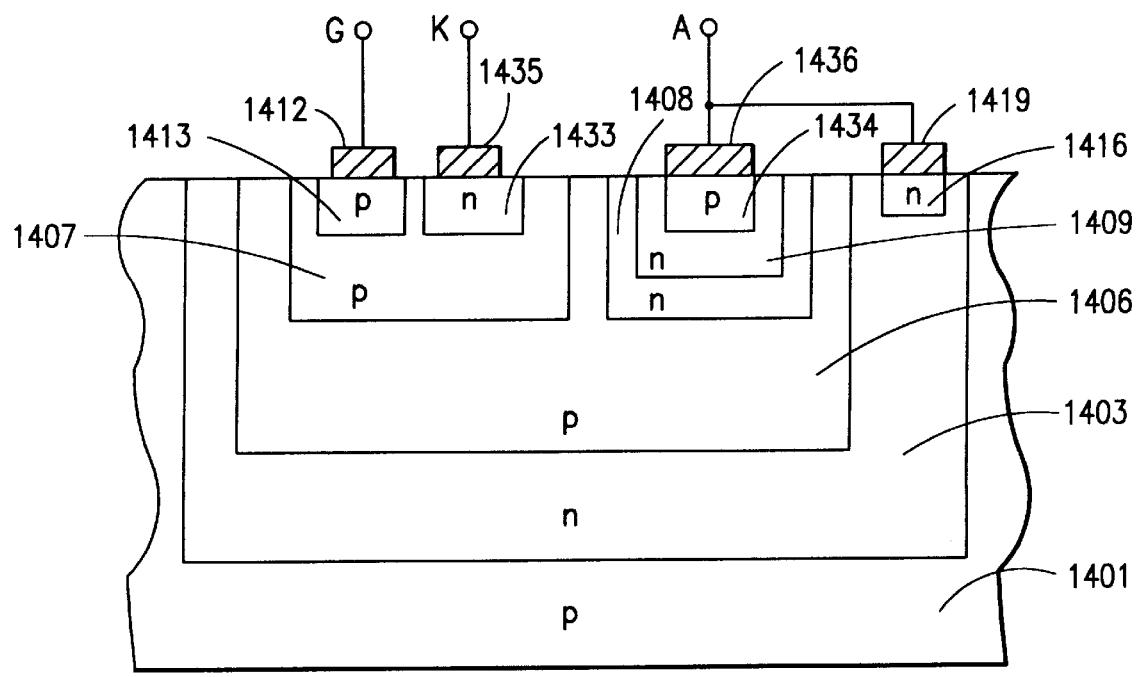
FIG. 14 is a cross section of a fourteenth embodiment, a lateral thyristor, according to the present invention.

Referring to FIG. 14, a lateral thyristor according to a fourteenth embodiment of the present invention is shown. A p-type substrate 1401 contains in its surface portion an n-type well region 1403 preferably formed by impurity ion implantation and subsequent diffusion. A p-type well region 1406 is disposed in a surface portion of n-type well region 1403. A p-type base region 1407 is disposed in a first surface portion of p-type well region 1406. An n-type cathode region 1433 is disposed in a first surface portion of p-type base region 1407. An n-type base region 1408 is disposed in a second surface portion of p-type well region 1406. These first and second surface portions are separated apart from each other by part of p-type well region 1406. An n-type buffer region 1409 containing a p-type anode region 1434 is disposed in a surface portion of n-type base region 1408. An n-type contact region 1416 is disposed in a surface portion of n-type well region 1403.

A gate electrode 1412 on p-type contact region 1413 is connected to a gate terminal G. A cathode electrode 1435 on n-type cathode region 1433 is connected to a cathode terminal K. An anode electrode 1436 on p-type anode region 1434 is connected to an anode terminal A. An auxiliary electrode 1419 is on n-type contact region 1416. An inter-layer insulation film, metal wiring, passivation film, or other such material may be optionally formed.

Fifteenth embodiment

Figure 15:
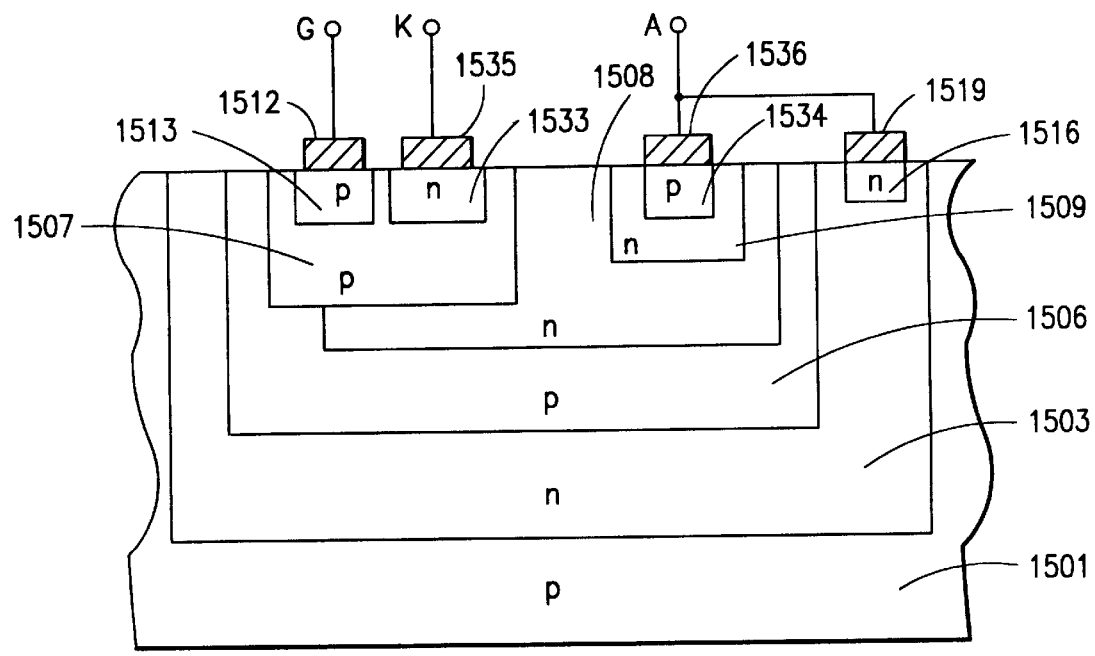
FIG. 15 is a cross section of a fifteenth embodiment, a lateral thyristor, according to the present invention.

Referring to FIG. 15, a lateral thyristor according to a fifteenth embodiment of the present invention is shown. A p-type substrate 1501 contains in its surface portion an n-type well region 1503 preferably formed by impurity ion implantation and subsequent diffusion. A p-type well region 1506 is disposed in a surface portion of n-type well region 1503. An n-type base region 1508 in a surface portion of a p-type well region 1506 is so large as to contain a p-type base region 1507. An n-type cathode region 1533 is disposed in a first surface portion of p-type base region 1507. An n-type base region 1508 is disposed in a second surface portion of p-type well region 1506. An n-type buffer region 1509 containing a p-type anode region 1534 is disposed in a surface portion of n-type base region 1508. An n-type contact region 1516 is disposed in a surface portion of n-type well region 1503.

A gate electrode 1512 on p-type contact region 1513 is connected to a gate terminal G. A cathode electrode 1535 on n-type cathode region 1533 is connected to a cathode terminal K. An anode electrode 1536 on p-type anode region 1534 is connected to an anode terminal A. An auxiliary electrode 1519 is on n-type contact region 1516. An inter-layer insulation film, metal wiring, passivation film, or other such material may be optionally formed.

A gate current from gate electrode 1512 to cathode electrode 1535 injects a large number of electrons from n-type cathode region 1533 to p-type base region 1507 and n-type base region 1508. A large number of holes are injected from p-type anode 1534. As a result, the lateral thyristor turns on, causing conductivity modulation and flowing a large current between terminals A and K. Since n-type well region 1503 is electrically connected to p-type anode region 1534 via n-type contact region 1516, a parasitic pnp transistor with p-type substrate 1501 as its collector remains off. The problems of the prior art are thus avoided. The device of this embodiment greatly lowers switching loss as does the first embodiment.

In these thyristor arrangements, the n-type well region may be replaced by an epitaxial layer. Auxiliary electrode 1519 on n-type contact region 1516 is optionally not be connected to anode electrode 1536, similar to the foregoing IGBT's, in order to bias auxiliary electrode 1519 at a high potential. Auxiliary electrode 1519 is optionally not disposed on n-type contact region 1516 to float the potential of n-type well region 1503. These modifications neither change the operations of the lateral thyristors nor impair their merits.

The other lateral thyristors, shown in FIGS. 14–18, function similarly, thereby greatly reducing switching loss.

Sixteenth embodiment

Figure 16:
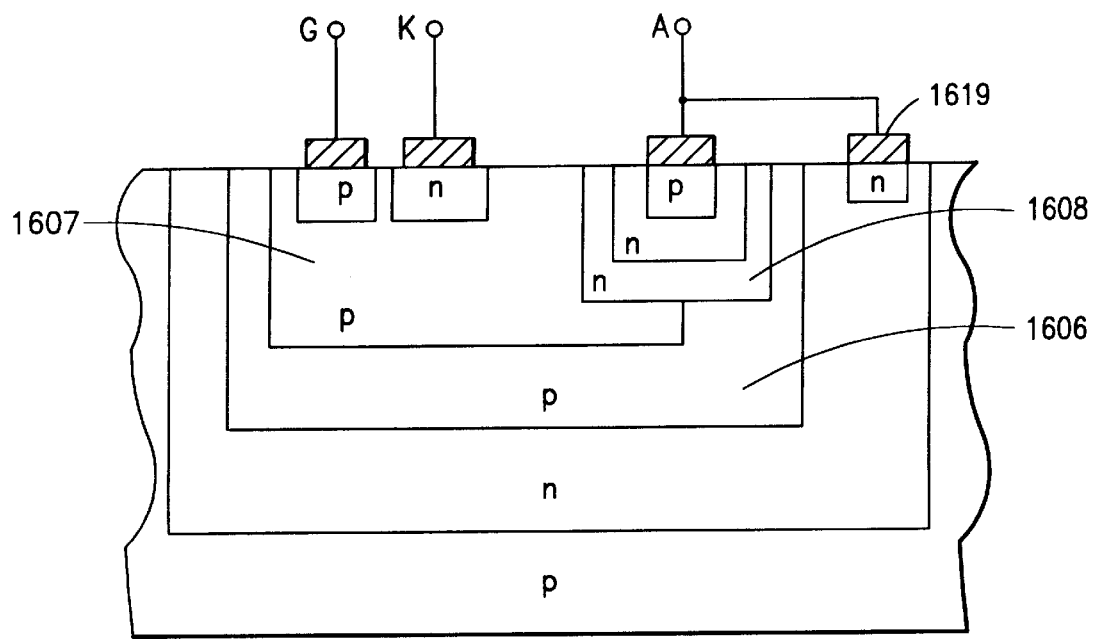
FIG. 16 is a cross section of a sixteenth embodiment, a lateral thyristor, according to the present invention.

Referring to FIG. 16, a lateral thyristor according to a sixteenth embodiment is shown. Since the sixteenth through eighteenth embodiments are a modification of the fourteenth and fifteenth embodiments, discussion of the structural similarities is omitted. An n-type base region 1608 is formed in a part of a surface portion of a p-type base region 1607. The functioning is the same as previously described.

Seventeenth embodiment

Figure 17:
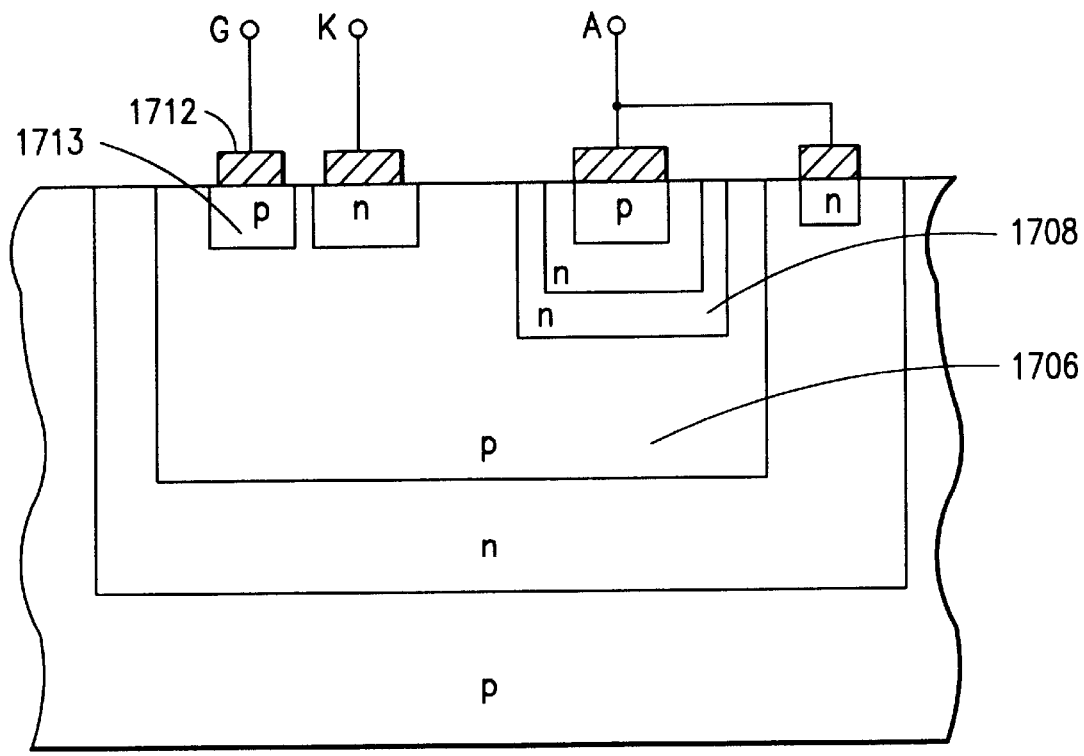
FIG. 17 is a cross section of a seventeenth embodiment, a lateral thyristor, according to the present invention.

Referring to FIG. 17, a lateral thyristor according to a seventeenth embodiment is shown. The p-type base region (reference numeral 1607 in FIG. 16) is large enough to contain completely an n-type base region 1708 (reference numeral 1608 in FIG. 16). Since the p-type base region overlaps a p-type well region 1706 in this device, the p-type base region is omitted. A gate electrode 1712 is on a p-type contact region 1713 disposed in p-type well region 1706.

Eighteenth embodiment

Figure 18:
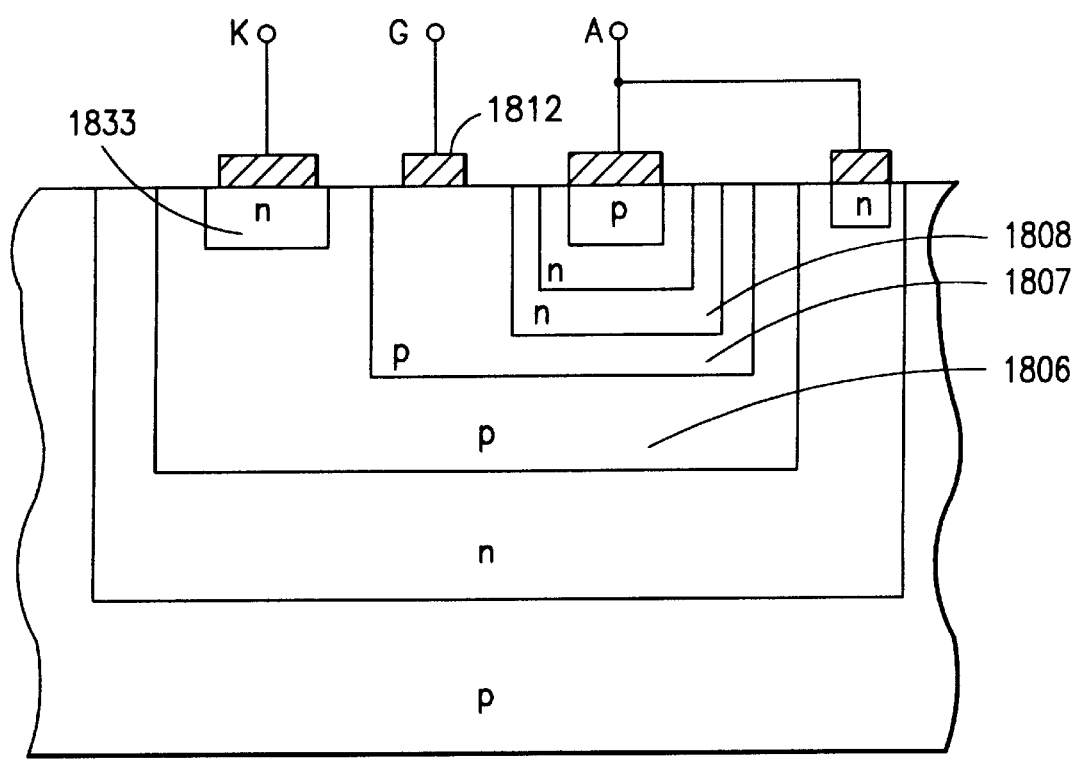
FIG. 18 is a cross section of an eighteenth embodiment, a lateral thyristor, according to the present invention.

Referring to FIG. 18, a lateral thyristor according to an eighteenth embodiment is shown. A p-type base region 1807 is formed to contain an n-type base region 1808 but not to contain an n-type cathode region 1833. A gate electrode 1812 is on p-type base region 1807.

FIGS. 19 through 23 are cross sections of nineteenth through twenty third embodiments showing lateral MOS control thyristors (LMCT) integrated into respective power IC's.

Nineteenth embodiment

Figure 19:
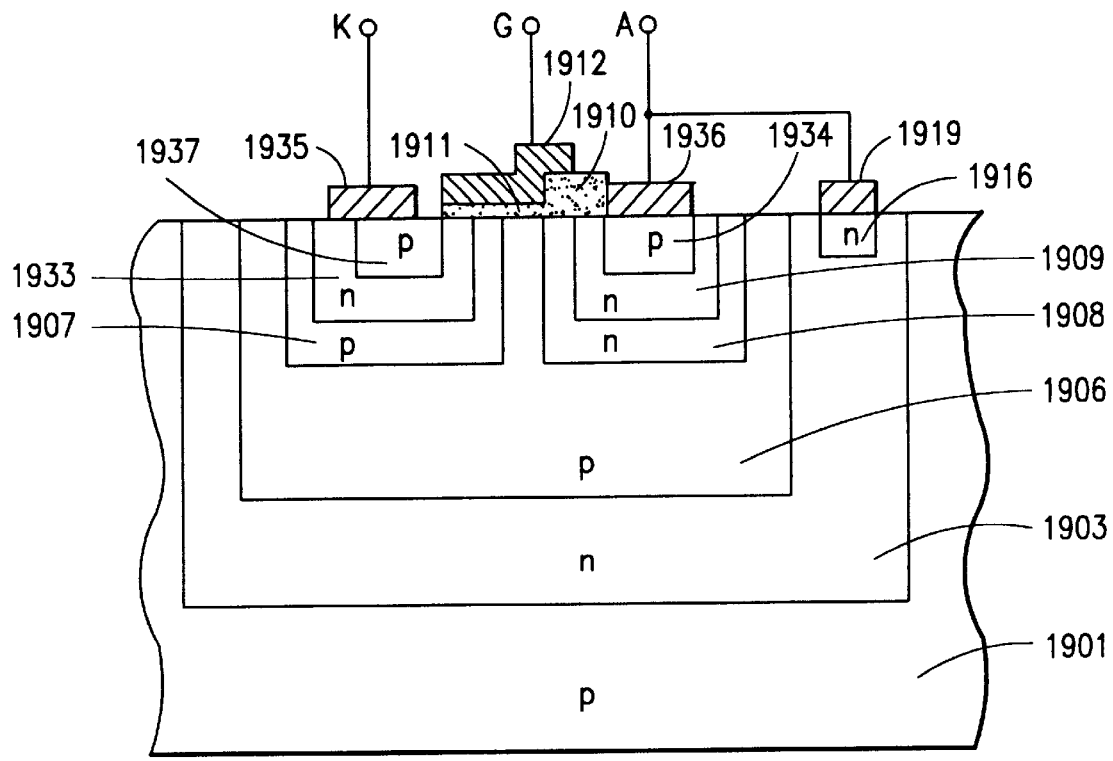
FIG. 19 is a cross section of a nineteenth embodiment, an LMCT, according to the present invention.

Referring now to FIG. 19, a lateral MOS control thyristor (hereinafter referred to as an "LMCT") according to the nineteenth embodiment includes a p-type substrate 1901 which contains an n-type well region 1903 in its surface portion formed by impurity ion implantation and subsequent diffusion. A p-type well region 1906 is disposed in a surface portion of n-type well region 1903. A p-type base region 1907 is disposed in a first surface portion of p-type well region 1906. An n-type cathode region 1933 containing a p-type cathode region 1937 is disposed in a surface portion of p-type base region 1907. An n-type base region 1908 is disposed in a second surface portion of p-type well region 1906. The first and second surface portions are separated from each other by a portion of p-type well region 1906.

An n-type buffer region 1909, doped more heavily than n-type base region 1908, is disposed in n-type base region 1908 to prevent punch-through in n-type base region 1908. A p-type anode region 1934 is disposed in a surface portion of n-type buffer region 1909.

An insulation film such as a thick oxide film 1910 is on n-type base region 1908. An n-type contact region 1916 is in a surface portion of n-type well 1903 to lower contact resistance between an auxiliary electrode 1919 and the device. P-type cathode region 1937 and n-type base region 1908 are separated by extended portions of n-type cathode region 1933, p-type base region 1907, and p-type well region 1906. A gate oxide film 1911 is on these extended portions. A polycrystalline silicon gate electrode 1912 is on gate oxide film 1911. Gate electrode 1912 is connected to a gate terminal G. A cathode electrode 1935 makes common contact with n-type cathode region 1933 and p-type cathode region 1937.

Cathode electrode 1935 is connected to a cathode terminal K. An anode electrode 1936 is on p-type anode region 1934. Anode electrode 1936 is connected to an anode terminal A. Auxiliary electrode 1919 is connected to anode electrode 1936. An inter-layer insulation film, metal wiring, passivation film, or other such material may be optionally formed.

Operation of the devices of FIGS. 19–23 are explained by way of the LMCT of the nineteenth embodiment. A positive voltage, higher than a threshold value, is applied across gate electrode 1912 and cathode electrode 1935. Applying this voltage creates an inversion layer in surface layers of p-type base region 1907 and p-type well region 1906 below gate electrode 1912. Electrons flow from cathode region 1933 to n-type base region 1908 via the inversion layer. The electrons are injected into p-type anode region 1934. This electron current functions as a base current of a pnp transistor consisting of p-type anode region 1934, n-type buffer region 1909 and n-type base region 1908, and p-type base region 1907. The base current turns on the transistor, thereby causing conductivity modulation to occur. As a result of this conductivity modulation, a large current flows between terminals A and K.

Applying a negative voltage, higher than a threshold value, across gate electrode 1912 and cathode electrode 1935, creates an inversion layer in a surface layer of n-type cathode region 1933 below gate electrode 1912. Since p-type cathode region 1937 is connected via the inversion layer to p-type base region 1907 while n-type cathode region 1933 is disconnected, electrons are not fed to n-type base region 1908. The transistor therefore turns off, interrupting the current flow between the terminals A and K.

Since n-type well region 1903 is electrically connected to p-type anode region 1934 via n-type contact region 1916, a parasitic pnp transistor with p-type substrate 1901 as its collector remains off. Therefore, the foregoing problems of the prior art are avoided. The device of FIG. 19 greatly lowers switching loss as does the first embodiment.

N-type buffer region 1909 is optionally omitted in some cases. The n-type well region is optionally replaced by an epitaxial layer. An auxiliary electrode 1919 on n-type contact region 1916 is optionally not connected to anode electrode 1936, similar to the IGBT of the second embodiment, to bias auxiliary electrode 1919 at a high potential. Alternatively, auxiliary electrode 1919 is not disposed, thereby floating the potential of the n-type semiconductor region outside the p-type well region. These modifications neither change the operations of the LMCT's nor impair their merits.

Though the above embodiments are explained by way of n-channel LMCT's, it is apparent to one skilled in the art that the structures of the invention are applicable to p-channel LMCT's, including semiconductor regions of opposite conductivity type to those of the n-channel LMCT's.

The LMCT's of FIGS. 20–23 function similarly, thereby greatly reducing switching loss.

Twentieth embodiment

Figure 20:
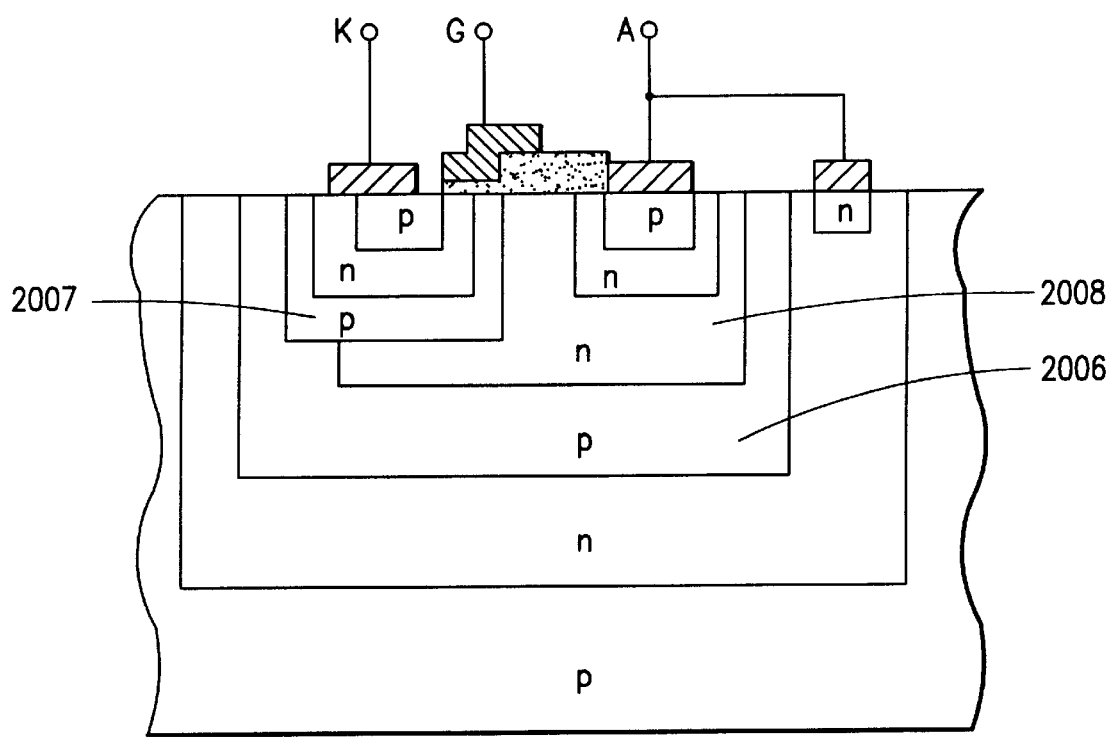
FIG. 20 is a cross section of a twentieth embodiment, an LMCT, according to the present invention.

Referring to FIG. 20, an LMCT according to a twentieth embodiment is shown. Since the twentieth through twenty-third embodiments are a modification of the nineteenth embodiment, discussion of the structural similarities is omitted. An n-type base region 2008 in a surface portion of a p-type well region 2006 is made large enough to contain a p-type base region 2007. N-type base region 2008, which contains a part of p-type base region 2007 in FIG. 20, is optionally extended to completely contain p-type base region 2007.

Twenty-first embodiment

Figure 21:
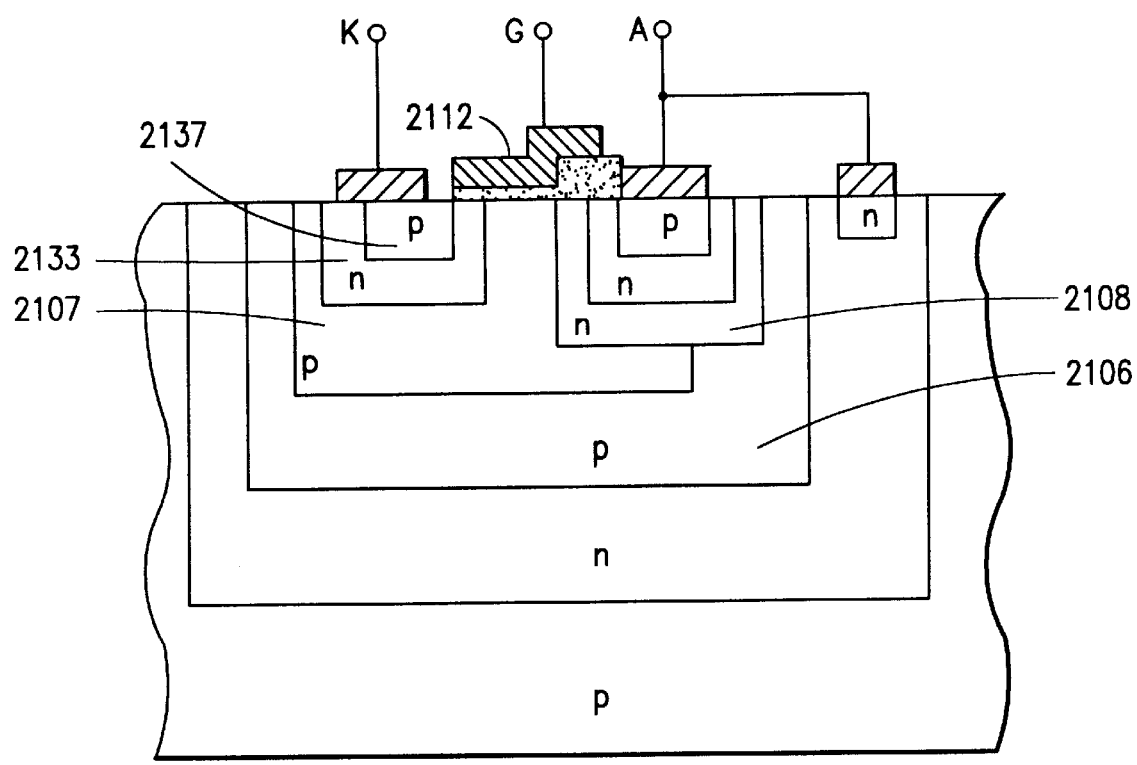
FIG. 21 is a cross section of a twenty-first embodiment, an LMCT, according to the present invention.

Referring to FIG. 21, an LMCT according to a twenty-first embodiment is shown. A p-type well region 2106 contains a p-type base region 2107. An n-type base region 2108 is formed partly in a surface portion of p-type base region 2107 and partly in a surface portion of p-type well region 2106. An n-type cathode region 2133 in a portion of p-type base region 2107 contains a p-type cathode region 2137. Since p-type well region 2106 doesn't extend between n-type base region 2108 and p-type cathode region 2137, a gate electrode 2112 is only above n-type cathode region 2133 and p-type base region 2107.

Twenty-second embodiment

Figure 22:
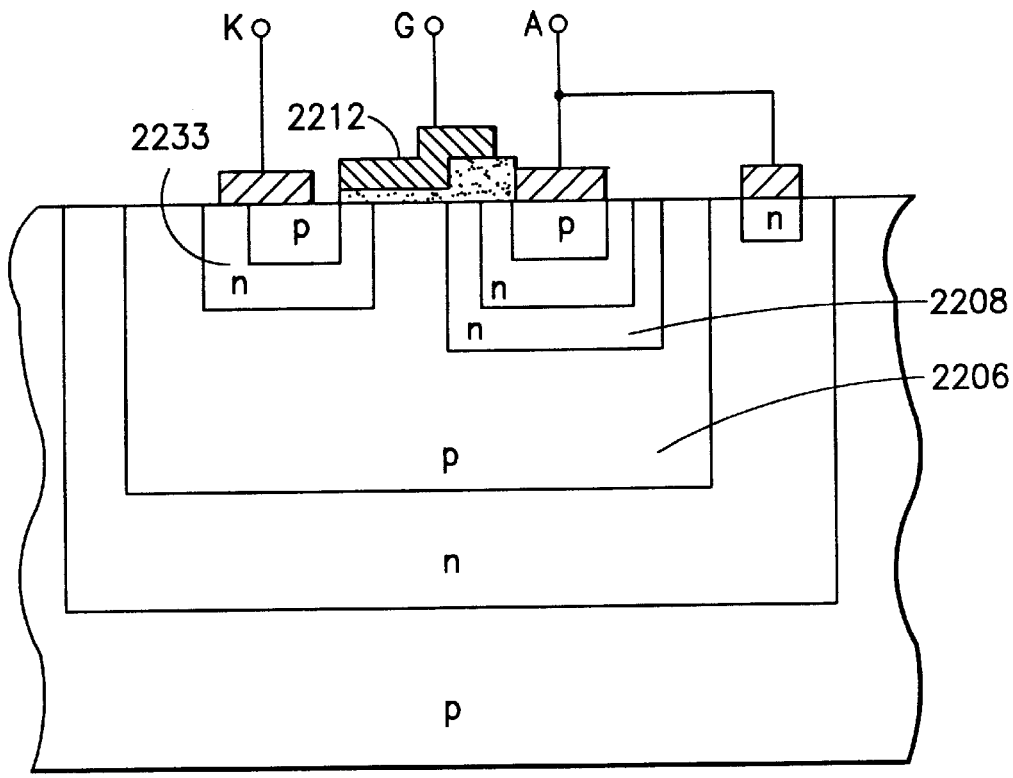
FIG. 22 is a cross section of a twenty second embodiment, an LMCT, according to the present invention.

Referring to FIG. 22, an LMCT according to a twenty-second embodiment is shown in which a p-type base region (reference numeral 2107 in FIG. 21) is omitted. Alternatively, this embodiment may be considered as having a virtual p-type base region so large as to completely contain an n-type base region 2108 and to overlap a p-type well 2206. A gate electrode 2212 is above an n-type cathode region 2233 and a p-type well region 2206.

Figure 23:
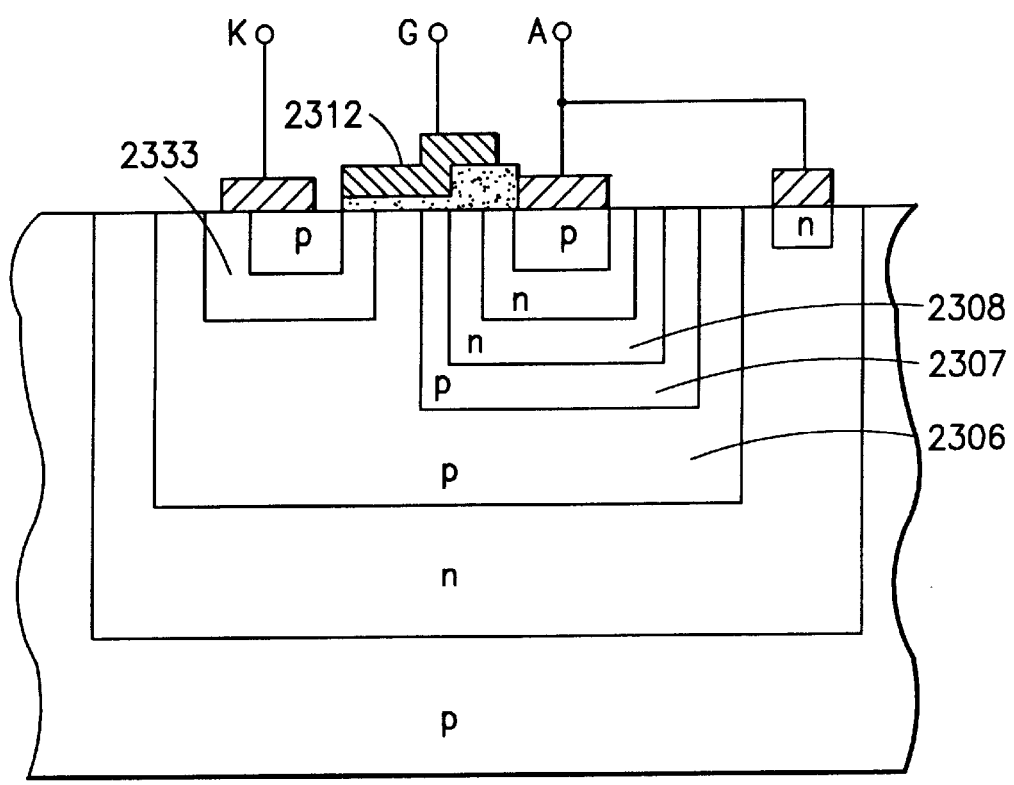
FIG. 23 is a cross section of a twenty third embodiment, an LMCT, according to the present invention.
Figure 24:
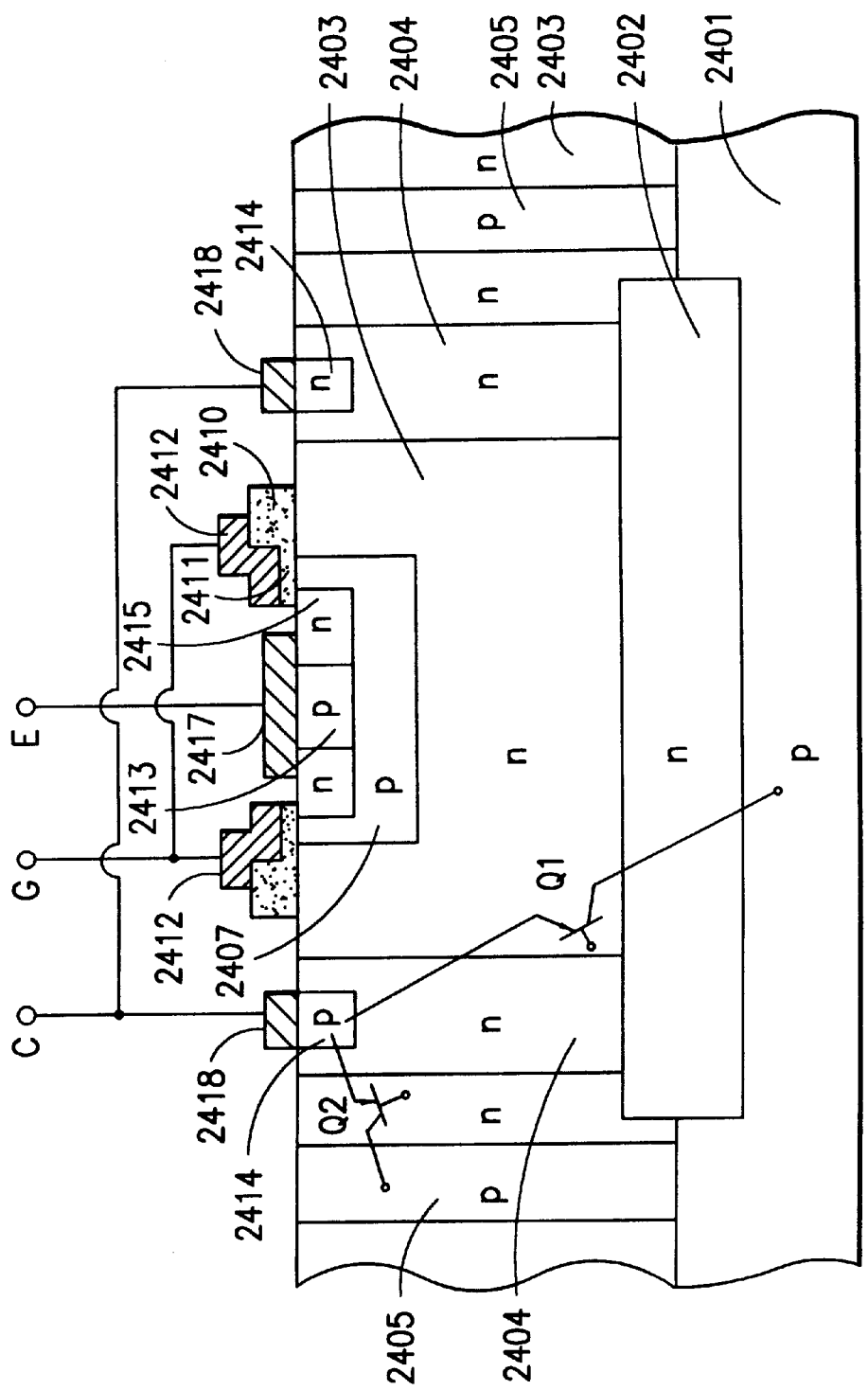
FIG. 24 is a cross section of a conventional LIGBT according to the prior art.
Figure 25:
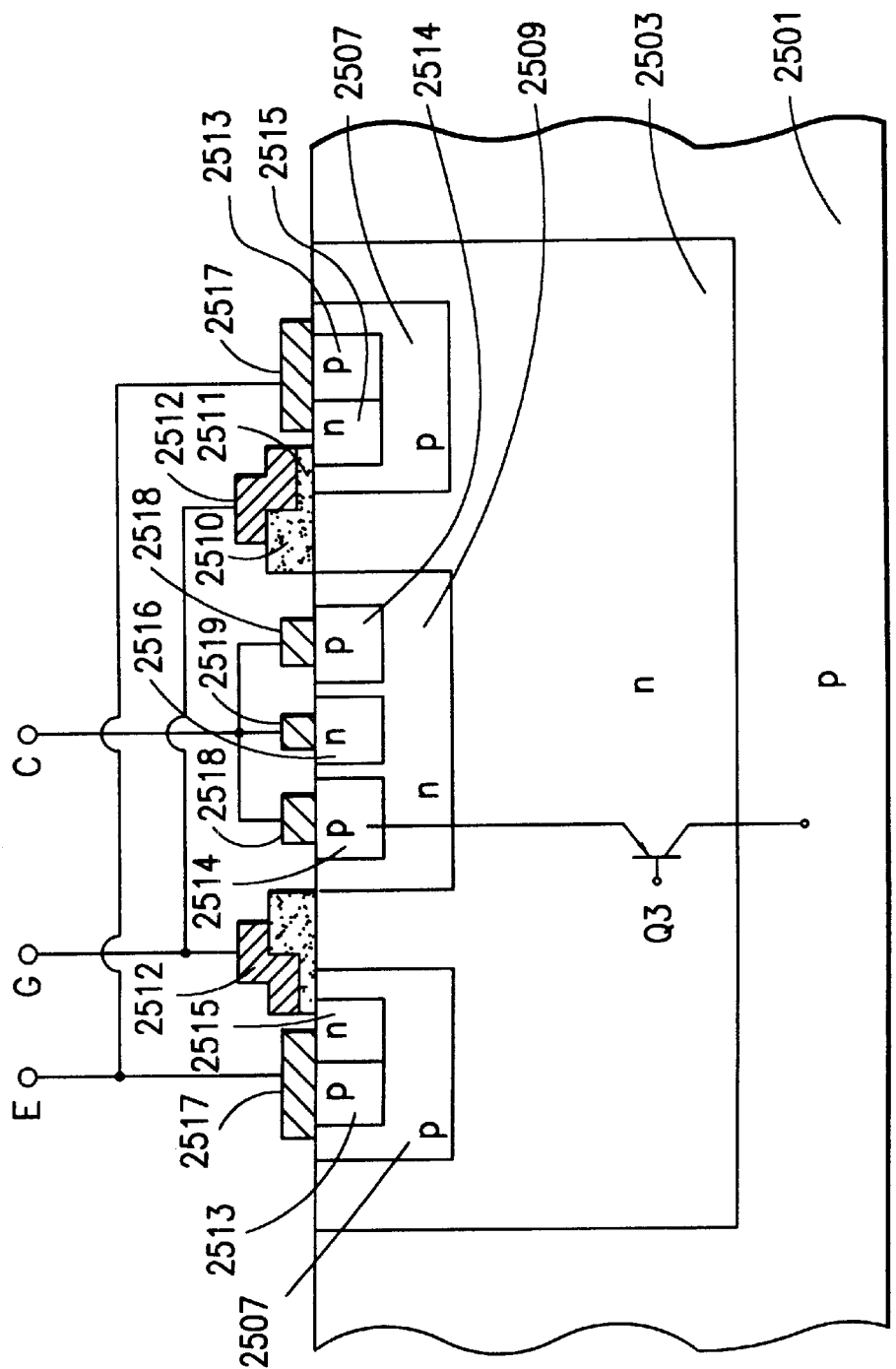
FIG. 25 is a cross section of a conventional LIGBT according to the prior art.

Twenty-third embodiment Referring to FIG. 23, an LMCT according to a twenty-third embodiment is shown in which a p-type base region 2307 is formed so as to contain an n-type base region 2308 but not to contain an n-type cathode region 2333. A gate electrode 2312 is above n-type cathode region 2333, p-type well region 2306, and p-type base region 2307.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A lateral semiconductor arrangement comprising:
a semiconductor substrate of a first conductivity type;
a first semiconductor region of a second conductivity type on said semiconductor substrate;
a semiconductor device;
said semiconductor device including a well region of said first conductivity type in a surface portion of said first semiconductor region;
a first main electrode on said well region;
a second main electrode on said well region;
a control electrode disposed above said well region;
said semiconductor device is a lateral MOSFET;
a base region of said second conductivity type in a first portion of said well region;
a drain region of said first conductivity type above said base region;
a source region of said first conductivity type in a second portion of said well region, said source region being spaced apart laterally from said base region by said well region;
said control electrode being a gate electrode;
said gate electrode being fixed via a gate insulation film to a portion of said base region, said portion extending between said well region and said drain region;
said second main electrode being a source electrode;
said source electrode making common contact with said source region and said base region; and
said first main electrode being a drain electrode on said drain region.

2. A lateral semiconductor comprising:
a semiconductor substrate of a first conductivity type;
a first semiconductor region of a second conductivity type on said semiconductor substrate;
a semiconductor device;
said semiconductor device including a well region of said first conductivity type in a surface portion of said first semiconductor region;
a first main electrode on said well region;
a second main electrode on said well region;
a control electrode disposed above said well region;
said semiconductor device is a lateral MOSFET;
a base region of said second conductivity type in said well region;
a source region of said first conductivity type above a first portion of said base region;
a drain region of said first conductivity type in a second portion of said base region, said drain region being spaced apart laterally from said source region;
said control electrode being a gate electrode;
said gate electrode being fixed via a gate insulation film to a portion of said base region, said portion extending between said source region and said drain region;
said second main electrode being a source electrode;
said source electrode making common contact with said source region and said base region; and
said first main electrode being a drain electrode on said drain region.

3. A lateral semiconductor arrangement comprising:
a semiconductor substrate of a first conductivity type;
a first semiconductor region of a second conductivity type on said semiconductor substrate;
a semiconductor device;
said semiconductor device including a well region of said first conductivity type in a surface portion of said first semiconductor region;

a first main electrode on said well region;

a second main electrode on said well region;

a control electrode disposed above said well region;

said semiconductor device is a lateral MOSFET;

a drain region of said second conductivity type in a first portion of said well region;

a source region of said second conductivity type in a second portion of said well region, said source region being spaced apart laterally from said drain region;

said control electrode comprises a gate electrode;

said gate electrode being fixed via a gate insulation film to a portion of said well region, said portion extending between said source region and said drain region;

said second main electrode comprises a source electrode on said source region; and said first main electrode comprises a drain electrode on said drain region.

4. A lateral semiconductor arrangement comprising:

a semiconductor device;

said semiconductor device having a first region of a first conductivity type;

said semiconductor device having a second region surrounding said first region, said second region being of a second conductivity type;

said second region being surrounded by a surrounding region of a first conductivity type;

a first main electrode;

said first main electrode being connected to said first region of said semiconductor device;

means for connecting said surrounding region of said first conductivity type to said first main electrode;

a semiconductor substrate of a second conductivity type;

said surrounding region forming a well region above said semiconductor substrate;

a parasitic transistor being formed between said semiconductor substrate and said well region; and said means for connecting reducing a carrier accumulation in said semiconductor substrate by suppressing an operation of said parasitic transistor, thereby shortening a switching time of said lateral semiconductor device.

5. A lateral semiconductor device according to claim 4, wherein said lateral semiconductor device is a lateral MOSFET.

6. A lateral semiconductor arrangement, comprising:

a semiconductor device formed in a well region of a first conductivity said semiconductor device having a first region of a first conductivity type;

said semiconductor device having a second region surrounding said first region, said second region being of a second conductivity type;

said well region being surrounded by a surrounding region of a second conductivity type;

a first main electrode;

said first main electrode being connected to said first region of said semiconductor device;

means for connecting said surrounding region of said second conductivity type to said first main electrode;

a semiconductor substrate of a first conductivity type;

a parasitic transistor having said semiconductor substrate as its collector; and said means for connecting reducing a carrier accumulation in said semiconductor substrate by suppressing operation of said parasitic transistor, thereby shortening a switching time of said lateral semiconductor device.

* * * * *